(12) United States Patent
Yamanaka et al.

(10) Patent No.: US 10,777,711 B2
(45) Date of Patent: Sep. 15, 2020

(54) WAVELENGTH CONVERSION ELEMENT AND LIGHT EMITTING DEVICE

(71) Applicant: PANASONIC INTELLECTUAL PROPERTY MANAGEMENT CO., LTD., Osaka (JP)

(72) Inventors: Kazuhiko Yamanaka, Osaka (JP); Hideki Kasugai, Shiga (JP); Hirotaka Ueno, Osaka (JP); Kimihiro Murakami, Osaka (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 41 days.

(21) Appl. No.: 15/951,897

(22) Filed: Apr. 12, 2018

(65) Prior Publication Data

US 2018/0233633 A1 Aug. 16, 2018

Related U.S. Application Data

(63) Continuation of application No. PCT/JP2016/004585, filed on Oct. 14, 2016.

(30) Foreign Application Priority Data

Oct. 20, 2015 (JP) .................................. 2015-206792

(51) Int. Cl.
*H01L 33/50* (2010.01)
*F21V 29/502* (2015.01)
(Continued)

(52) U.S. Cl.
CPC .............. *H01L 33/502* (2013.01); *F21S 2/00* (2013.01); *F21S 41/16* (2018.01); *F21S 41/176* (2018.01);
(Continued)

(58) Field of Classification Search
CPC ... H01L 33/502; H01L 33/62; H01L 33/0054; H01L 33/60; H01L 33/504; H01L 33/507;
(Continued)

(56) References Cited

U.S. PATENT DOCUMENTS

2009/0321771 A1 12/2009 Hattori et al.
2011/0216550 A1* 9/2011 Koike ..................... F21S 41/16
362/519

(Continued)

FOREIGN PATENT DOCUMENTS

JP   2010-010560 A   1/2010
JP   2012-089316 A   5/2012
(Continued)

OTHER PUBLICATIONS

International Search Report (ISR) and Written Opinion dated Jan. 17, 2017 in International (PCT) Application No. PCT/JP2016/004585; with partial English translation.

(Continued)

*Primary Examiner* — Mouloucoulaye Inoussa
(74) *Attorney, Agent, or Firm* — McDermott Will & Emery LLP

(57) ABSTRACT

A light emitting device includes a wavelength conversion element, and an excitation light source which radiates excitation light to the wavelength conversion element. The wavelength conversion element includes a support member having a supporting surface, and a wavelength conversion member disposed on the supporting surface so as to be contained within the support member when the support member is viewed from the supporting surface side. An outer peripheral region on the support member, which is an outer peripheral portion of an arrangement region including the wavelength conversion member and is exposed from the wavelength conversion member, includes a light absorbing (Continued)

portion which can absorb first light having same wavelength as the excitation light or a light scattering portion which can scatter the first light. The arrangement region includes a reflective member which is disposed between the wavelength conversion member and the support member, and is different from the support member.

20 Claims, 24 Drawing Sheets

(51) Int. Cl.
| | |
|---|---|
| *F21S 2/00* | (2016.01) |
| *F21V 7/22* | (2018.01) |
| *F21S 41/176* | (2018.01) |
| *F21S 41/16* | (2018.01) |
| *H01L 33/00* | (2010.01) |
| *H01L 33/60* | (2010.01) |
| *H01L 33/62* | (2010.01) |
| *G02B 5/02* | (2006.01) |

(52) U.S. Cl.
CPC .............. *F21V 7/22* (2013.01); *F21V 29/502* (2015.01); *H01L 33/0054* (2013.01); *H01L 33/60* (2013.01); *H01L 33/62* (2013.01); *G02B 5/021* (2013.01); *G02B 5/0236* (2013.01)

(58) Field of Classification Search
CPC ... H01L 25/167; H01L 33/44; H01L 33/0075; H01L 33/32; F21S 41/16; F21S 41/176; F21S 41/125; F21S 41/135; F21S 41/365; F21S 41/18; F21S 41/285; F21S 41/321; F21S 41/323; F21S 41/19; F21V 7/22; F21V 29/502; F21V 9/32; F21V 7/28; F21V 5/04; F21V 9/38; F21V 9/30; F21V 29/74; G02B 5/021; G02B 27/1006; G02B 5/0205; G02B 5/20; G02B 5/0236; F21K 9/64; F21Y 2115/30; F21Y 2115/10; C09K 11/02; C09K 11/7774; C09K 11/7792; H01S 5/022; H01S 5/0609; B60Q 1/28
USPC ........... 257/76, 98, 96, E33.068; 438/46, 29; 362/510, 509, 84
See application file for complete search history.

(56) References Cited

U.S. PATENT DOCUMENTS

| | | | |
|---|---|---|---|
| 2012/0224384 A1* | 9/2012 | Takahira | F21V 9/30 362/509 |
| 2013/0334539 A1* | 12/2013 | Kojima | H01L 33/44 257/76 |
| 2014/0218893 A1* | 8/2014 | Tamura | F21V 9/30 362/84 |
| 2014/0231845 A1* | 8/2014 | Akimoto | H01L 33/46 257/98 |
| 2015/0252964 A1 | 9/2015 | Takahashi et al. | |
| 2016/0040857 A1 | 2/2016 | Inoue et al. | |
| 2016/0104824 A1* | 4/2016 | Furuyama | H01L 33/46 257/98 |
| 2017/0307163 A1* | 10/2017 | Nagasaki | H01L 33/0045 |

FOREIGN PATENT DOCUMENTS

| | | |
|---|---|---|
| JP | 2012-093454 A | 5/2012 |
| JP | 2012-222050 A | 11/2012 |
| JP | 2012-226986 A | 11/2012 |
| JP | 2014-153527 A | 8/2014 |
| JP | 2015-050124 A | 3/2015 |
| WO | 2015/140001 A1 | 9/2015 |

OTHER PUBLICATIONS

Extended European Search Report issued in European Patent Application No. 16857088.5, dated Oct. 1, 2018.

\* cited by examiner

FIG. 25

LIST OF PROPERTIES OF MATERIALS EXAMINED

| MATERIAL | THERMAL EXPANSION (×10⁻⁶) | THERMAL CONDUCTIVITY (W/m/K) | REFLECTANCE AT 450 nm (%) |
|---|---|---|---|
| Glass | 0.8 | 1.0 | – |
| YAG | 7 | 30 | – |
| $Al_2O_3$ | 7 | 30 | – |
| Silicon | 3.2 | 150 | 40 |
| SiC | 3.8 | 300 | 10 - 30 |
| Diamond (CVD) | 0.8 | 1000 | 10 - 30 |
| Aluminum (A1050) | 24 | 230 | 92 |
| Silver | 20 | 420 | 95 |
| Copper (C1020) | 17 | 390 | 50 - 60 |
| Gold | 14 | 310 | 40 - 50 |

WAVELENGTH CONVERSION ELEMENT AND LIGHT EMITTING DEVICE

CROSS REFERENCE TO RELATED APPLICATIONS

This application is a U.S. continuation application of PCT International Patent Application Number PCT/JP2016/004585 filed on Oct. 14, 2016, claiming the benefit of priority of Japanese Patent Application Number 2015-206792 filed on Oct. 20, 2015, the entire contents of which are hereby incorporated by reference.

BACKGROUND

1. Technical Field

The present disclosure relates to wavelength conversion elements which can be used in a variety of lighting apparatuses and devices, such as headlamps for vehicles and light sources for spotlights, and light emitting devices including the wavelength conversion elements.

2. Description of the Related Art

Wavelength conversion elements which can be used in a variety of lighting apparatuses and devices, such as headlamps for vehicles and light sources for spotlights, and light emitting devices including the wavelength conversion elements are known in the related art (for example, see Japanese Unexamined Patent Application Publication No. 2010-10560). A light emitting device disclosed in Japanese Unexamined Patent Application Publication No. 2010-10560 will now be described with reference to the drawings. FIG. 28A is a side view illustrating light emitting device 900 disclosed in Japanese Unexamined Patent Application Publication No. 2010-10560. FIG. 28B is an enlarged view of wavelength conversion element 914 and mount substrate 10 disclosed in Japanese Unexamined Patent Application Publication No. 2010-10560.

As illustrated in FIG. 28A, light emitting device 900 includes mount substrate 910 including wiring layer 916a, light emitting element 912 disposed on wiring layer 916 of mount substrate 910, and wavelength conversion element 914 disposed on mount substrate 910. As illustrated in FIG. 28B, wavelength conversion element 914 includes substrate 920, layer 922 of a particulate material having a high refractive index, fluorescent layer 924, and inorganic transparent material layer 926 disposed in sequence on substrate 920.

In light emitting device 900, fluorescent layer 924 is irradiated with laser light emitted from light emitting element 912. Fluorescent layer 924 absorbs part of the laser light emitted from light emitting element 912 as excitation light, and emits fluorescence. Part of the laser light emitted from light emitting element 912 and not absorbed by fluorescent layer 924 and the fluorescence emitted from fluorescent layer 924 are scattered by at least one of fluorescent layer 924 and layer 922 of a particulate material having a high refractive index, and are emitted from light emitting device 900.

SUMMARY

In light emitting device 900 disclosed in PTL 1, the region to be irradiated with emitted light has a shape corresponding to the shape of fluorescent layer 924 in a top surface view of substrate 920. To control the shape of the region to be irradiated with emitted light such that the shape of the region corresponds to the shape of fluorescent layer 924, fluorescent layer 924 should be irradiated with laser light such that the end of fluorescent layer 924 is covered with the laser light. In this case, part of the laser light emitted from light emitting element 912 is radiated to portions outside fluorescent layer 924, and is emitted from light emitting device 900 as non-scattered stray light. The stray light may affect the illuminance distribution properties of light emitting device 900.

An object of the present disclosure is to provide a wavelength conversion element which can prevent the emission of incident light (that is, excitation light) which is not scattered, and a light emitting device including the wavelength conversion element.

To solve the problem, one aspect of the light emitting device according to the present disclosure is a light emitting device including a wavelength conversion element, and an excitation light source which emits excitation light to the wavelength conversion element. The wavelength conversion element includes a support member having a supporting surface, and a wavelength conversion member disposed on the supporting surface of the support member so as to be contained within the support member in a top surface view of the support member. An outer peripheral region of the support member exposed from the wavelength conversion member corresponds to an outer peripheral portion of an arrangement region where the wavelength conversion member is disposed. The outer peripheral region of the support member includes a light absorbing portion which can absorb first light having a wavelength identical to the wavelength of the excitation light or a light scattering portion which can scatter the first light.

In such a configuration, at least part of incident light (that is, excitation light) which does not enter the wavelength conversion member is absorbed or scattered by the outer peripheral region, preventing the emission of the incident light which is not scattered after entering the wavelength conversion element from the excitation light source. Accordingly, a light emitting device having excellent illuminance distribution properties can be achieved.

Furthermore, in one aspect of the light emitting device according to the present disclosure, the first light may be the excitation light.

In such a configuration, the excitation light entering the outer peripheral region on the support member can be absorbed, preventing the excitation light entering the outer peripheral region from being emitted from light emitting device. For this reason, a light emitting device having excellent illuminance distribution properties can be achieved.

Furthermore, in one aspect of the light emitting device according to the present disclosure, in the arrangement region, a reflective member may be disposed between the wavelength conversion member and the support member.

In such a configuration, the excitation light entering the wavelength conversion member and the fluorescence having a wavelength converted by the wavelength conversion member can be reflected by the reflective member, and be emitted as emitted light. Accordingly, the light emitting device can emit light having improved luminance.

Furthermore, in one aspect of the light emitting device according to the present disclosure, the support member may contain silicon, silicon carbide, sapphire, or diamond as a material used in the support member, and the excitation light may directly enter a surface of the support member.

Such a configuration can enhance the thermal conductivity of the support member, improving the heat dissipating properties of the support member.

Furthermore, in one aspect of the light emitting device according to the present disclosure, the light scattering portion may have a surface including depressions and projections.

In such a configuration, the incident light can be scattered by the depressions and projections, preventing the emission of the excitation light which is not scattered after entering the wavelength conversion element from excitation light source.

Furthermore, in one aspect of the light emitting device according to the present disclosure, the depressions and projections may have inclinations formed on the support member.

Such a configuration can scatter the incident light on the depressions and projections having the inclinations, preventing the emission of the excitation light which is not scattered after entering the wavelength conversion element from the excitation light source.

Furthermore, in one aspect of the light emitting device according to the present disclosure, the inclinations may also be formed in the arrangement region.

In such a configuration, the excitation light entering the wavelength conversion member and the fluorescence having a wavelength converted by the wavelength conversion member can be scattered by the inclinations. For this reason, the generation of the excitation light emitted without being scattered can be prevented.

Furthermore, in one aspect of the light emitting device according to the present disclosure, the depressions and projections may be disposed on a surface of a scattering member, which is disposed on the support member, and contains particles having a high refractive index and a transparent binder.

Such a configuration enables the formation of the light scattering portion without processing the surface of the support member. The properties of the light scattering portion can be controlled with higher freedom.

Furthermore, in one aspect of the light emitting device according to the present disclosure, the light scattering portion may be a scattering member, which is disposed on the support member, and contains particles having a high refractive index and a transparent binder.

Such a configuration enables the formation of the light scattering portion without processing the surface of the support member. The properties of the light scattering portion can be controlled with higher freedom.

To achieve the object of the present disclosure, the wavelength conversion element according to the present disclosure includes a support member having a supporting surface, and a wavelength conversion member disposed on the supporting surface and containing a fluorescent material which absorbs excitation light and generates fluorescence. The supporting surface includes an arrangement region where the wavelength conversion member is disposed, and an outer peripheral region disposed outside the arrangement region and exposed from the wavelength conversion member. The outer peripheral region includes a light scattering portion having depressions and projections at an interface of the light scattering portion.

In such a configuration, at least part of the excitation light not entering the wavelength conversion member is scattered by the depressions and projections of the light scattering portion. For this reason, the emission of the excitation light which is not scattered can be prevented in the case where the excitation light enters the wavelength conversion element from the excitation light source. Accordingly, a light emitting device having excellent illuminance distribution properties can be achieved.

Furthermore, in one aspect of the wavelength conversion element according to the present disclosure, the arrangement region may include a reflective member disposed between the wavelength conversion member and the support member.

In such a configuration, the excitation light and the fluorescence having a wavelength converted by the wavelength conversion member can be reflected by the reflective member in the case where the excitation light enters the wavelength conversion member. For this reason, light having enhanced luminance can be emitted from the wavelength conversion element.

Furthermore, in one aspect of the wavelength conversion element according to the present disclosure, the support member may be a crystalline substrate.

In such a configuration, depressions and projections having a desired structure can be formed through anisotropic etching of the surface of the support member.

Furthermore, in one aspect of the wavelength conversion element according to the present disclosure, the depressions and projections have inclinations disposed on the supporting surface. The depressions and projections have depressed portions having a depth of 1 µm or more and 4 µm or less. The ratio of the depth to the width of the depressed portions is 0.1 or more and 1 or less.

Such a configuration can achieve a sufficient scattering effect of the light scattering portion.

Furthermore, in one aspect of the wavelength conversion element according to the present disclosure, the light scattering portion has a surface roughness at least equal to a surface roughness of the arrangement region.

Furthermore, in one aspect of the wavelength conversion element according to the present disclosure, the depressions and projections may have vertex portions having a curvature.

Such a configuration can ensure the scattering of incident light on the vertex portions of the depressions and projections because the vertex portions are not flat.

Furthermore, in one aspect of the wavelength conversion element according to the present disclosure, the light scattering portion may be a first scattering member disposed on the supporting surface and containing particles having a high refractive index and transparent binder.

Such a configuration enables the formation of the light scattering portion without processing the surface of the support member. The properties of the light scattering portion can be controlled with higher freedom.

Furthermore, in one aspect of the wavelength conversion element according to the present disclosure, the reflective member may be a second scattering member.

Such a configuration enables multiple reflection of part of incident light entering the wavelength conversion member at an interface between the wavelength conversion member and the first scattering member disposed in the outer peripheral region and at an interface between the wavelength conversion member and the second scattering member disposed in the support member, and thus white light can be efficiently emitted from the wavelength conversion member.

Furthermore, in one aspect of the wavelength conversion element according to the present disclosure, the second scattering member may be formed of a material different from a material for the first scattering member.

Such a configuration can achieve a higher freedom in the configuration of the scattering member which covers the bottom surface and lateral surfaces of the wavelength conversion member.

Furthermore, in one aspect of the wavelength conversion element according to the present disclosure, the support member may contain silicon, silicon carbide, sapphire, or diamond as a material to be used.

Such a configuration can enhance the thermal conductivity of the support member, and can improve the heat dissipating properties of the support member.

One aspect of the light emitting device according to the present disclosure includes the wavelength conversion element according to any one of the aspects described above, and an excitation light source which emits the excitation light to the wavelength conversion element.

Such a configuration can prevent the emission of the excitation light which is not scattered after entering the wavelength conversion element from the excitation light source. For this reason, a light emitting device having excellent illuminance distribution properties can be achieved.

Furthermore, in one aspect of the light emitting device according to the present disclosure, the excitation light may be radiated to the wavelength conversion member and the light scattering portion.

Such a configuration can prevent the emission of the excitation light which is not scattered, because the excitation light radiated to the light scattering portion is scattered.

Furthermore, in one aspect of the light emitting device according to the present disclosure, in a cross-section of the supporting surface including an optical axis of the excitation light, a sum of a width of the light scattering portion and a width of the arrangement region in the cross-section may be $2.2 \times 2\omega_0$ or more where $\omega_0$ represents a distance from a position where the excitation light has a maximum intensity to a position where the excitation light has an intensity of light equal to $1/e^2$ of the maximum intensity.

Such a configuration can sufficiently reduce the intensity of the excitation light radiated to portions outside the light scattering portion and wavelength conversion member.

Furthermore, in one aspect of the light emitting device according to the present disclosure, an absorption coefficient of the excitation light in the light scattering portion may be at least equal to an absorption coefficient of the excitation light in the arrangement region.

Such a configuration can absorb the excitation light in the light scattering portion, preventing the emission of the excitation light entering the light scattering portion from the light emitting device. For this reason, a light emitting device having excellent illuminance distribution properties can be achieved.

The present disclosure can provide a wavelength conversion element which can prevent the emission of incident light which is not scattered, and a light emitting device including the wavelength conversion element.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 25 is a table showing materials for a support member of the wavelength conversion element according to the present disclosure examined herein and their properties;

DETAILED DESCRIPTION OF THE EMBODIMENTS

Embodiments according to the present disclosure will now be described with reference to the drawings. These embodiments described below are illustrative as preferred specific examples of the present disclosure. Accordingly, numeral values, components, arrangements, positions, and connection forms of the components, steps, order of the steps, and the like shown in the embodiments below are only examples, and will not limit the present disclosure. Among the components of the embodiments below, the components not described in an independent claim representing the most superordinate concept of the present disclosure are described as arbitrary components.

Embodiment 1

A wavelength conversion element according to Embodiment 1 will now be described with reference to the drawings.

Figure 1:
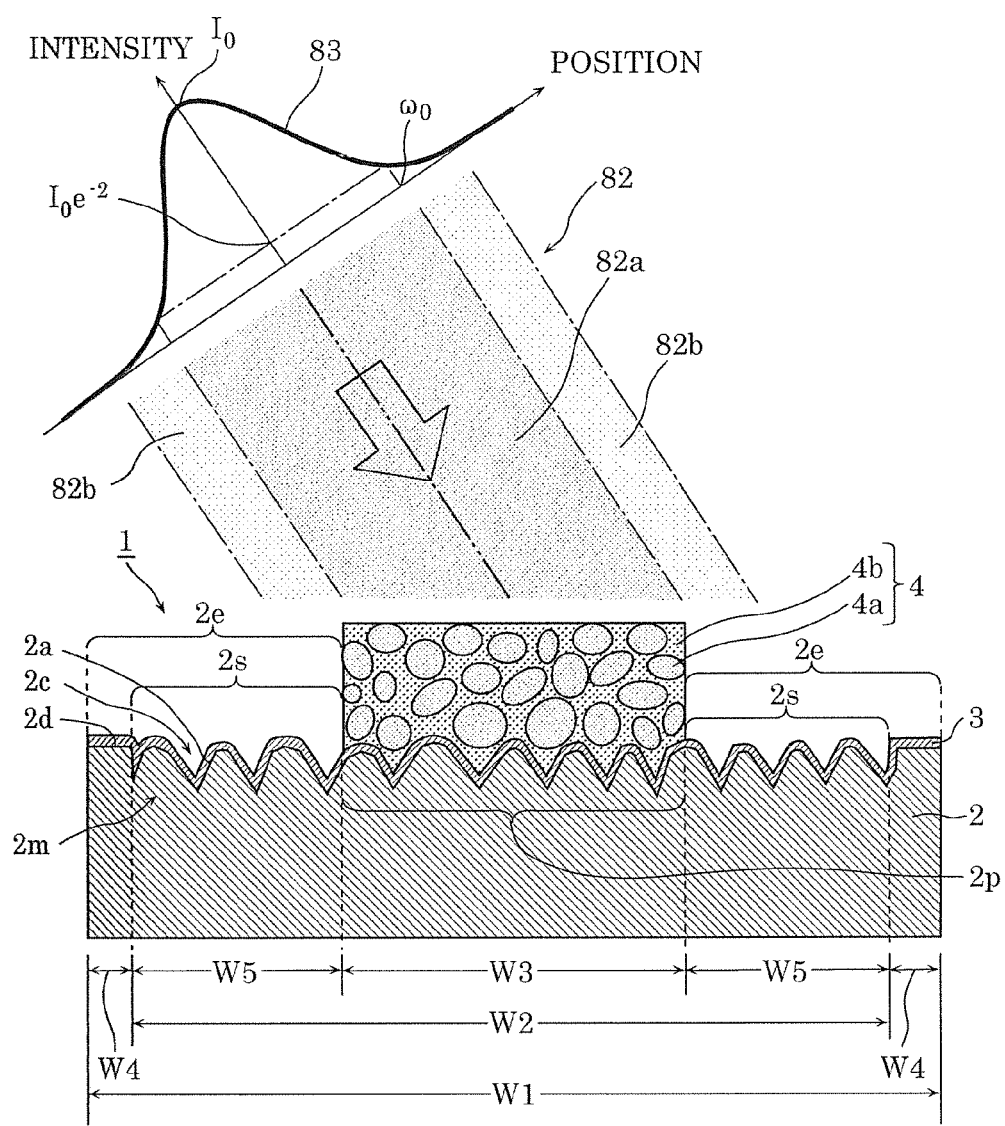
FIG. 1 is a schematic cross-sectional view illustrating a configuration of the wavelength conversion element according to Embodiment 1.

FIG. 1 is a schematic cross-sectional view illustrating a configuration of wavelength conversion element 1 according to the present embodiment.

As illustrated in FIG. 1, wavelength conversion element 1 according to Embodiment 1 includes support member 2 having supporting surface 2m, and wavelength conversion member 4 disposed on supporting surface 2m and containing fluorescent material 4a which absorbs excitation light and generates fluorescence. Supporting surface 2m includes arrangement region 2p including wavelength conversion member 4, and outer peripheral region 2e disposed outside arrangement region 2p and exposed from wavelength conversion member 4. As illustrated, wavelength conversion element 1 includes wavelength conversion member 4 disposed on supporting surface 2m so as to be contained within support member 2 in a view of support member 2 from supporting surface 2m side.

Outer peripheral region 2e of supporting surface 2m includes light scattering portion 2s including depressions and projections disposed at the interface. In the present embodiment, light scattering portion 2s includes depressions and projections disposed on the surface of support member 2. More specifically, light scattering portion 2s includes depressions and projections at an interface between supporting surface 2m and the surrounding air. Furthermore, in the present embodiment, the depressions and projections have inclinations 2a formed in support member 2. In the present embodiment, inclinations 2a are also formed in arrangement region 2p.

Such a configuration can scatter incident light 82 on light scattering portion 2s of supporting surface 2m even when part of incident light 82 entered from the outside of wavelength conversion element 1 is radiated to supporting surface 2m of support member 2 rather than to wavelength conversion member 4. For this reason, even when incident light 82 having high directivity enters wavelength conversion element 1, reflection of incident light 82 on support member 2 while keeping high directivity can be prevented. As a result, the emission of unnecessary light having high directivity from wavelength conversion element 1 can be prevented.

Wavelength conversion element 1 according to the present embodiment including non-essential, optional components will now be more specifically described with reference to the drawings.

Figure 2:
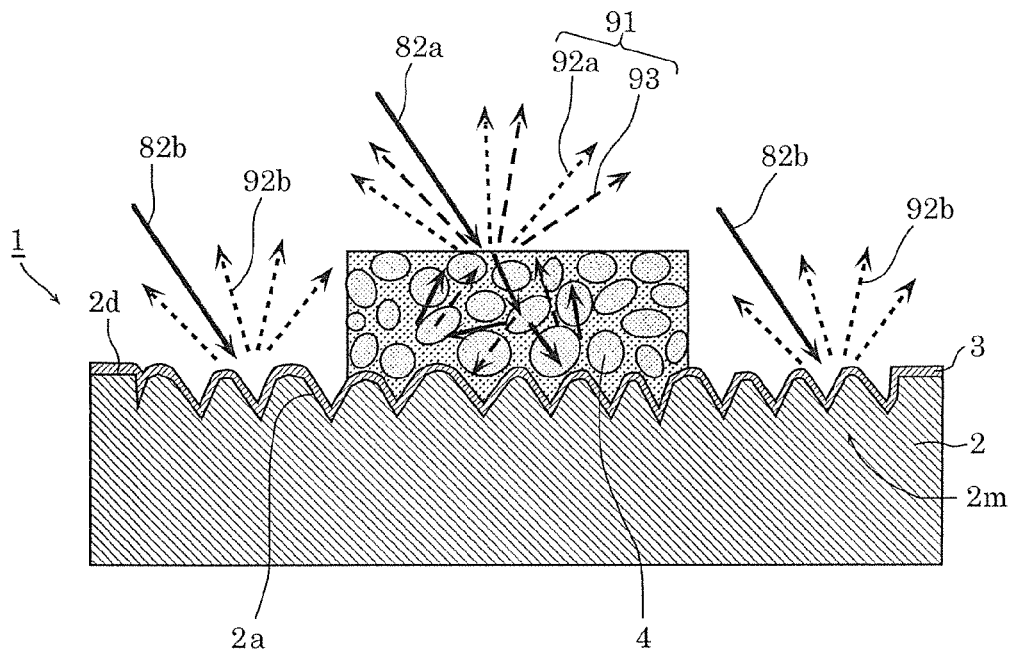
FIG. 2 is a schematic cross-sectional view illustrating the light scattering properties of the wavelength conversion element according to Embodiment 1.

FIG. 2 is a schematic cross-sectional view illustrating the light scattering properties of wavelength conversion element 1 according to the present embodiment.

As illustrated in FIG. 1, in wavelength conversion element 1, depressions and projections having fine inclinations 2a are disposed in a portion within supporting surface 2m of support member 2 excluding peripheral portion 2d having width W4. In other words, the internal region of supporting surface 2m has a structure having depressions and projections. Furthermore, supporting surface 2m includes reflective film 3. In the present embodiment, wavelength conversion member 4 is disposed in the central portion within a region of support member 2 including inclinations 2a. In any cross-section of wavelength conversion element 1 intersecting supporting surface 2m, width W2 of the region including inclinations 2a is smaller than width W1 of support member 2, and width W3 of wavelength conversion member 4 is smaller than width W2. Part of the region including inclinations 2a and excluding wavelength conversion member 4 having width W3 corresponds to light scattering portion 2s. In the present embodiment, light scattering portion 2s having width W5 is disposed so as to surround the outer periphery of wavelength conversion member 4.

At this time, in the depressions and projections having inclinations 2a, depressed portions 2c have a depth of 1 μm or more and 4 μm or less in terms of a peak-to-valley value in a 50 μm square region. In other words, the distance between a vertex portion and a bottom in the depressions and projections (distance in the direction vertical to supporting surface 2m of support member 2) is 1 μm or more and 4 μm or less in a 50 μm square region in supporting surface 2m. The ratio of the depth to the width is 0.1 or more and 1 or less where the width of depressed portion 2c is defined as a distance between adjacent vertices. In the present embodiment, the depressions and projections having inclinations 2a have shapes varied at random. Such depressions and projections scatter incident light at random, improving the scattering effect of the depressions and projections.

Wavelength conversion member 4 is, for example, a member formed of fluorescent material 4a, or a plurality of fluorescent particles, bonded with transparent binder 4b. More specifically, fluorescent material 4a to be used is fluorescent particles of a rare earth element-doped fluorescent substance. For example, a yttrium aluminum garnet (YAG), which is a fluorescent substance $(Ga, Y, Gd)_3Al_5O_{10}$ doped with cerium (Ce), is used. Transparent binder 4b to be used is, silicone, silicon oxide, such as a glass material, or a transparent material, such as aluminum oxide or zinc oxide, for example.

Support member 2 to be used is a substrate formed of a material having high thermal conductivity, specifically, a crystalline substrate, a metal substrate, or a ceramic substrate. In the case where support member 2 is a crystalline substrate, specifically, support member 2 may contain silicon (Si), silicon carbide (SiC), aluminum nitride (AlN), sapphire ($Al_2O_3$), or diamond as a material to be used. In the present embodiment, support member 2 to be used is a crystalline silicon substrate formed of silicon. Inclinations 2a are formed on support member 2 by performing a process, such as grinding, wet etching, or dry etching, on the surface of a crystalline substrate, a metal substrate, or a ceramic substrate. More preferably, a crystalline substrate is used as support member 2, and fine inclinations 2a are formed utilizing the crystal orientation of support member 2. Use of such a crystalline substrate leads to precise control of the shape and size of inclinations 2a.

Reflective film 3 is a reflective member including a metal film of aluminum (Al), silver (Ag), silver alloy, or platinum (Pt), and a protective film of $SiO_2$ disposed on the metal film, for example.

As illustrated in FIG. 1, wavelength conversion element 1 having such a configuration is irradiated with incident light 82 from immediately above or from a direction approximately oblique to wavelength conversion member 4. At this time, wavelength conversion element 1 is irradiated with incident light 82 or laser light having a center wavelength of 420 nm to 490 nm from a distant position, for example. In the laser light which propagates from a distant position, usually, the intensity of light on the optical axis is large, and the intensity of light reduces as the distance from the optical axis increases. In other words, the laser light which propagates from a distant position shows a Gaussian distribution of the intensity as illustrated in light intensity distribution 83 in FIG. 1. At this time, among light components of incident light 82, the light components near the optical axis having large intensity of light and radiated to wavelength conversion member 4 are referred to as central light components 82a, and the light components away from the optical axis having lower intensity of light than that of the light components on the optical axis and not radiated to wavelength conversion member 4 are referred to as peripheral light components 82b.

Here, assume that a two-dimensional intensity distribution in a cross-section vertical to the optical axis direction of incident light 82 is concentrically circular, and the light intensity distribution is an ideal Gaussian distribution. In a cross-section of supporting surface 2m containing the optical axis of incident light 82, the distance from a position where incident light 82 has a maximum intensity to a position where incident light 82 has $1/e^2$ (about 13.5%) of the maximum intensity is defined as $\omega_0$. The diameter of incident light 82 on supporting surface 2m is defined as $2\omega_0$. In other words, the width of the region where the intensity of light is $1/e^2$ (about 13.5%) or more of the central intensity (peak intensity) is defined as $2\omega_0$. Furthermore, assume that the shape in a top surface view of wavelength conversion member 4 (in a top surface view of supporting surface 2m) is circular, and diameter $2\omega_0$ of incident light 82 is identical to diameter W3 of wavelength conversion member 4. In this case, about 86.5% of the energy of incident light 82 is radiated to wavelength conversion member 4 while the remaining 13.5% is radiated to the surrounding regions of wavelength conversion member 4.

In the case where incident light 82 having a power of 10 W enters wavelength conversion element 1 under such conditions, central light components 82a having a power of about 8.7 W enter wavelength conversion member 4. As illustrated in FIG. 2, at least part of central light components 82a are absorbed by fluorescent material 4a in wavelength conversion member 4, and are converted into fluorescence 93 having a different wavelength. Fluorescence 93 is emitted from the same surface as that of wavelength conversion member 4, which incident light 82 enters. Among part of fluorescence 93 and light components of incident light 82, those not absorbed by fluorescent material 4a in wavelength conversion member 4 propagate toward support member 2. In the present embodiment, a reflective member formed of reflective film 3 is disposed between wavelength conversion member 4 and support member 2 in arrangement region 2p. For this reason, the light components which propagate toward support member 2 are reflected by reflective film 3. The light components reflected by reflective film 3 are emitted from wavelength conversion member 4 to the outside of wavelength conversion element 1 as scattered light 92a or fluorescence 93. As described above, reflective film 3 disposed between wavelength conversion member 4 and support member 2 can improve the luminance of the light emitted from wavelength conversion element 1. In the present embodiment, the depressions and projections having inclinations 2a are also disposed in arrangement region 2p. These depressions and projections can scatter part of light components of incident light 82 which enter wavelength conversion member 4, and reach support member 2 without being absorbed by fluorescent material 4a, preventing the emission of incident light which is not scattered after entering wavelength conversion element 1 from excitation light source 40.

As described above, wavelength conversion member 4 emits white light 91 as mixed light of fluorescence 93 and scattered light 92a.

In contrast, among the light components of incident light 82 having a light output of 10 W, peripheral light components 82b having a power of about 1.3 W may be stray light not radiated to wavelength conversion member 4. The stray light affects projected images from wavelength conversion element 1. In the case where light having diameter $2\omega_0$ smaller than diameter W3 of wavelength conversion member 4 is used as incident light to prevent such stray light, the center of wavelength conversion member 4 is irradiated with light having significantly large intensity of light. Such light increases the temperature of wavelength conversion member 4 and reduces the conversion efficiency. Furthermore, in this case, the peripheral portion of wavelength conversion member 4 is irradiated with only light having small intensity. For this reason, emitted light having a desired distribution shape corresponding to the shape in a top surface view of wavelength conversion member 4 cannot be achieved.

In the structure of the present embodiment, such peripheral light components 82b are irregularly reflected (scattered) by depressions and projections having inclinations 2a disposed on support member 2 in the peripheral portion of wavelength conversion member 4 as illustrated in FIG. 2. At this time, the directivity of incident light 82 is lost in the reflected light. For this reason, the conversion of the reflected light into stray light to be emitted in specific directions can be prevented. Furthermore, because peripheral light components 82b are reflected on outer peripheral region 2e of support member 2, the absorption of peripheral light components 82b by the peripheral portion of wavelength conversion member 4 in support member 2 can be prevented. Such a configuration can prevent an increase in temperature of wavelength conversion element 1 caused by heat generated in support member 2 and a reduction in conversion efficiency of wavelength conversion member 4.

The process of assembling a light emitting device using wavelength conversion element 1 according to the present embodiment will now be described with reference to the drawings.

To assemble a light emitting device using wavelength conversion element 1 according to the present embodiment, a process of fixing wavelength conversion element 1 will first be described.

Figure 3:
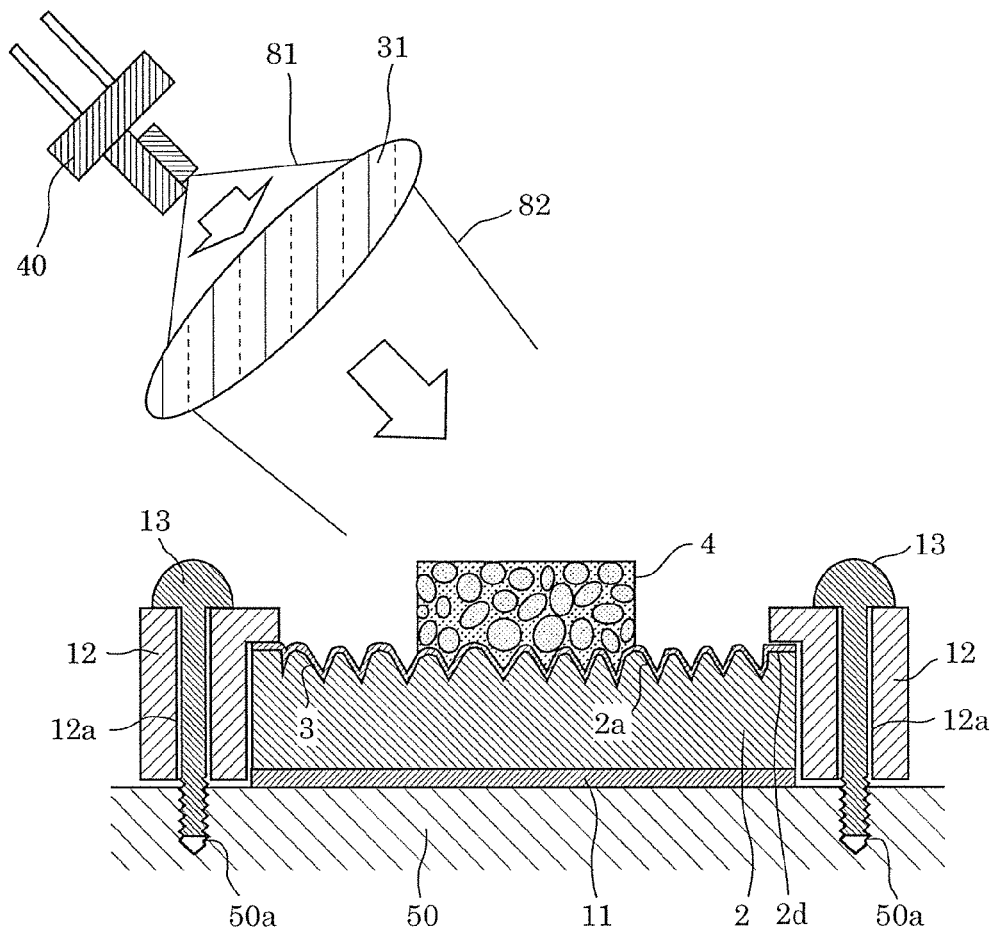
FIG. 3 is a diagram illustrating a configuration for fixing the wavelength conversion element according to Embodiment 1 to a fixing member.

FIG. 3 is a diagram illustrating a configuration for fixing wavelength conversion element 1 according to the present embodiment to fixing member 50.

As illustrated in FIG. 3, wavelength conversion element 1 is fixed to fixing member 50 using contact member 11, holding member 12, and screws 13.

Fixing member 50 is a member for fixing wavelength conversion element 1. Fixing member 50 includes screw holes 50a. Wavelength conversion element 1 is disposed on fixing member 50 with contact member 11 interposed therebetween.

Holding members 12 are members for holding wavelength conversion element 1 down to fixing member 50. Holding members 12 hold support member 2 near peripheral portion 2d having width W4 on supporting surface 2m of support member 2 where wavelength conversion member 4 is not disposed (see FIG. 1). Holding members 12 are fixed to fixing member 50 by threadedly engaging screws 13 to screw holes 50a through holes 12a of holding members 12. As described above, wavelength conversion element 1 is fixed to fixing member 50 through fixation of holding members 12, which hold wavelength conversion element 1, to fixing member 50. Wavelength conversion element 1 fixed using such a configuration is irradiated with incident light 82 as excitation light from above. Incident light 82 is generated by converting excitation light 81 emitted from excitation light source 40 into substantially parallel light through lens 31.

Fixing member 50 is a member formed of a material having high thermal conductivity, such as aluminum, aluminum alloy, surface-plated copper, or copper alloy. Contact member 11 is a sheet-like member formed of a material having high thermal conductivity, such as a graphite sheet, a heat dissipating silicone resin, or a soldering material.

An example in which a light emitting device and a light projector are provided using wavelength conversion element 1 will now be described with reference to the drawings.

Figure 4:
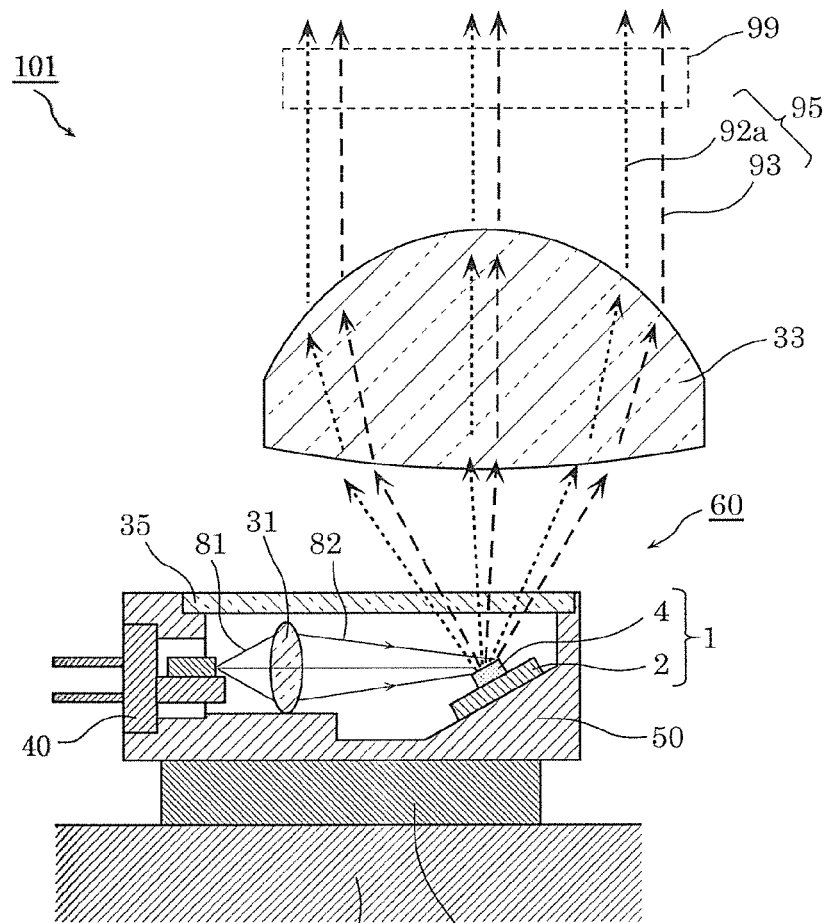
FIG. 4 is a schematic cross-sectional view illustrating a configuration of a light emitting device and a light projector according to Embodiment 1.

FIG. 4 is a schematic cross-sectional view illustrating a configuration of light emitting device 60 and light projector 101 according to the present embodiment.

As illustrated in FIG. 4, light emitting device 60 mainly includes wavelength conversion element 1, fixing member 50, excitation light source 40, and lens 31. Light projector 101 includes light emitting device 60 and projecting member 33. Light projector 101 may further include optical filter 99 having a predetermined transmission spectrum on the emission side of projecting member 33, for example.

In light emitting device 60, excitation light source 40 which emits excitation light 81 and lens 31 which excitation light 81 enters are fixed to fixing member 50. Although a configuration for fixing wavelength conversion element 1 is not illustrated in FIG. 4 for simplification, light emitting device 60 also has a configuration as illustrated in FIG. 3. In other words, wavelength conversion element 1 is fixed to fixing member 50 with holding members 12 and screws 13.

Excitation light source 40 is a semiconductor laser which emits laser light having a wavelength of 420 nm to 490 nm, for example. Excitation light 81 is emitted from excitation light source 40 through lens 31 fixed to fixing member 50, and is converted into incident light 82, which is substantially parallel light having high directivity. Incident light 82 then enters wavelength conversion member 4 of wavelength conversion element 1.

In such a configuration, in wavelength conversion member 4, incident light 82 is converted into white emitted light 95 including scattered light 92a and fluorescence 93. The white light passes through transparent cover member 35 attached to fixing member 50, and is emitted to the outside of light emitting device 60. In light projector 101 including light emitting device 60, and projecting member 33, such as a projection lens, disposed on the light path of emitted light 95 (above light emitting device 60 in FIG. 4), emitted light 95 or white light having high directivity can be emitted by projecting member 33. In light projector 101, fixing member 50 is fixed to external fixing base 75 with heat dissipating mechanism 70 formed of a graphite sheet, for example. Such a configuration can dissipate heat generated in excitation light source 40 and wavelength conversion element 1 to external fixing base 75.

As described above, light emitting device 60 and light projector 101 can be provided with a simple configuration using wavelength conversion element 1 and excitation light source 40 in the present embodiment. Support member 2 of wavelength conversion element 1 can be readily fixed to fixing member 50. Even when the irradiation region with incident light 82 entering wavelength conversion member 4 is substantially identical to the region where wavelength conversion member 4 is formed, peripheral light components 82b of incident light 82 reflected on portions other than wavelength conversion member 4 are scattered by the depressions and projections having inclinations 2a in light scattering portion 2s on supporting surface 2m. For this reason, the emission of peripheral light components 82b from the light emitting device as stray light having high intensity of light in specific directions can be prevented.

A method of designing the dimension of light scattering portion 2s of wavelength conversion element 1 will now be described with reference to the drawings.

Figure 5:
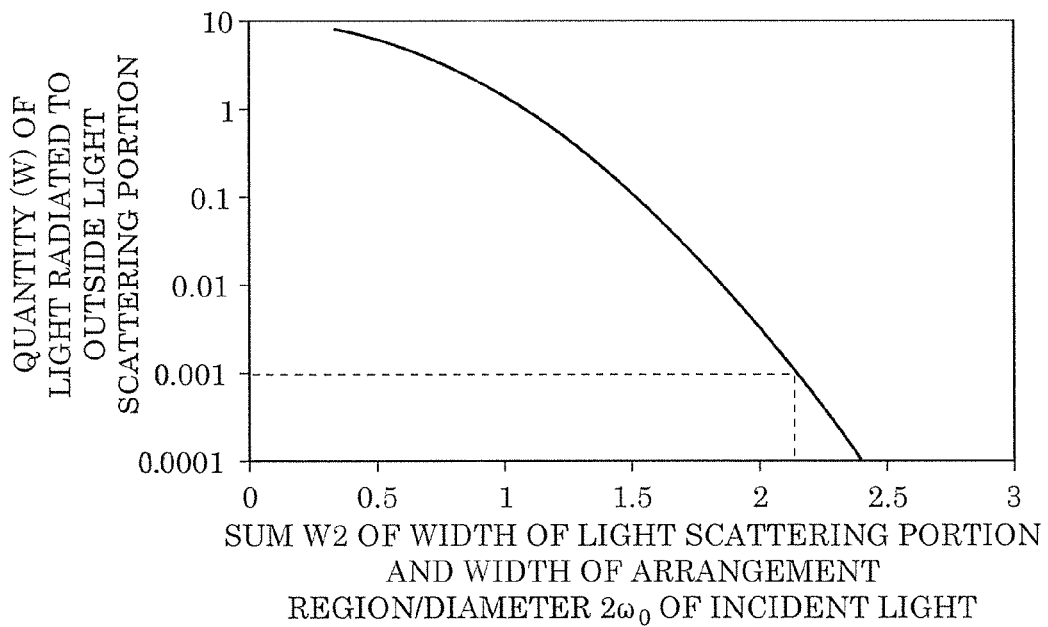
FIG. 5 is a graph illustrating the relation between the quantity of light radiated to portions outside the light scattering portion and the sum of the width of the light scattering portion and the width of the arrangement region when the wavelength conversion element according to Embodiment 1 is irradiated with incident light having a power of 10 W.

FIG. 5 is a graph showing the relation between the quantity of light radiated to the outside of light scattering portion 2s and sum W2 of the width of light scattering portion 2s and the width of arrangement region 2p when incident light 82 having a power of 10 W is radiated to wavelength conversion element 1 according to the present embodiment. FIG. 5 shows the relation determined by calculation. The term "quantity of light radiated to the outside of light scattering portion 2s" indicates the quantity of light components of incident light 82 which are not radiated to both of light scattering portion 2s and wavelength conversion member 4.

Here, assume that a two-dimensional intensity distribution of incident light 82 on supporting surface 2m is concentrically circular, and the light intensity distribution is an ideal Gaussian distribution. The abscissa in FIG. 5 represents the ratio of sum W2 of the width of light scattering portion 2s and the width of arrangement region 2p to diameter $2\omega_0$ of incident light 82. The graph shown in FIG. 5 indicates that of incident light 82, the relation represented by W2≥2.2×$2\omega_0$ should be satisfied to control the components to be radiated to the region outside light scattering portion 2s having inclinations 2a (that is, the components of incident light 82 which may be converted into stray light) to have a power of 1 mW or less, which is a low-risk level. Herein, the term "light having a power at a low-risk level" indicates light having a power at such a level that the influences of light over the eyes of a person who gazes at the light while blinking can be neglected. Light scattering portion 2s having a dimension thus determined can reduce the influences by stray light and achieve good illuminance distribution properties in the case where wavelength conversion element 1 is used in the light emitting device. This design method can be used in wavelength conversion member 4 having any shape and in cases where incident light 82 has a light intensity distribution other than the Gaussian distribution. Where the width of the light intensity distribution of incident light 82 is defined as width $2\omega_0$ of the region where the intensity of light is $1/e^2$ or more of peak intensity $I_0$, it is preferred that sum W2 be set in any cross-section of wavelength conversion element 1 such that the relation represented by W2≥2.2×2 $\omega_0$ is satisfied.

Although the irradiation region of the incident light is concentrically circular in the description above, the irradiation region can have any other shape. For example, the irradiation region of the incident light can have an oval shape according to the distribution shape of the incident light or the angle of incidence of the incident light. In this case, it is preferred that the relation of sum W2 of the width of light scattering portion 2s and the width of arrangement region 2p and diameter $2\omega_0$ of incident light 82 be established in any cross-section of the irradiation region.

A process of manufacturing wavelength conversion element 1 will now be described with reference to the drawings.

Figure 6:
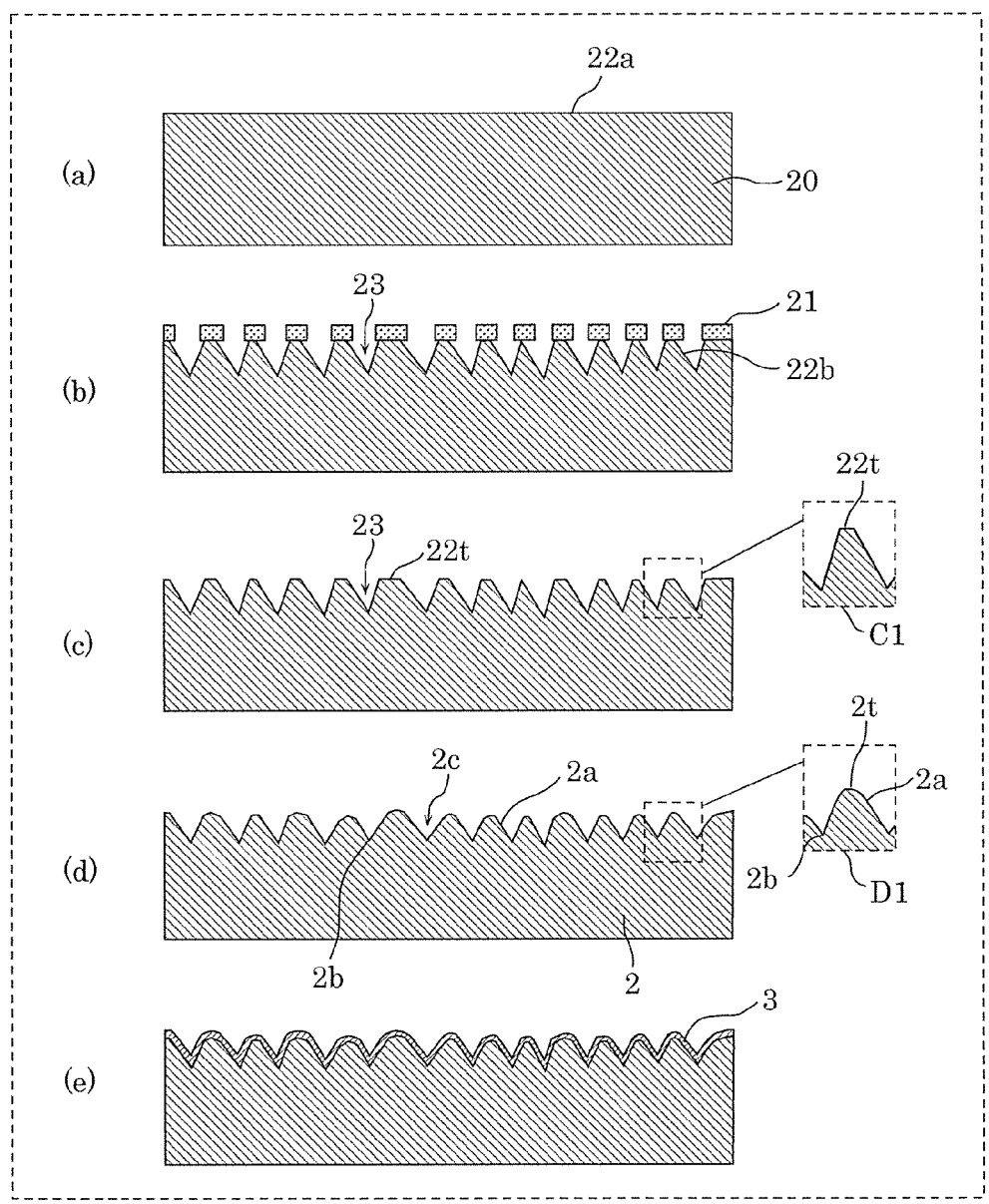
FIG. 6 is a schematic cross-sectional view illustrating a step of forming a support member in a process of manufacturing the wavelength conversion element according to Embodiment 1.

FIG. 6 is a schematic cross-sectional view illustrating the steps of forming support member 2 in the process of manufacturing wavelength conversion element 1 according to the present embodiment.

Figure 7:
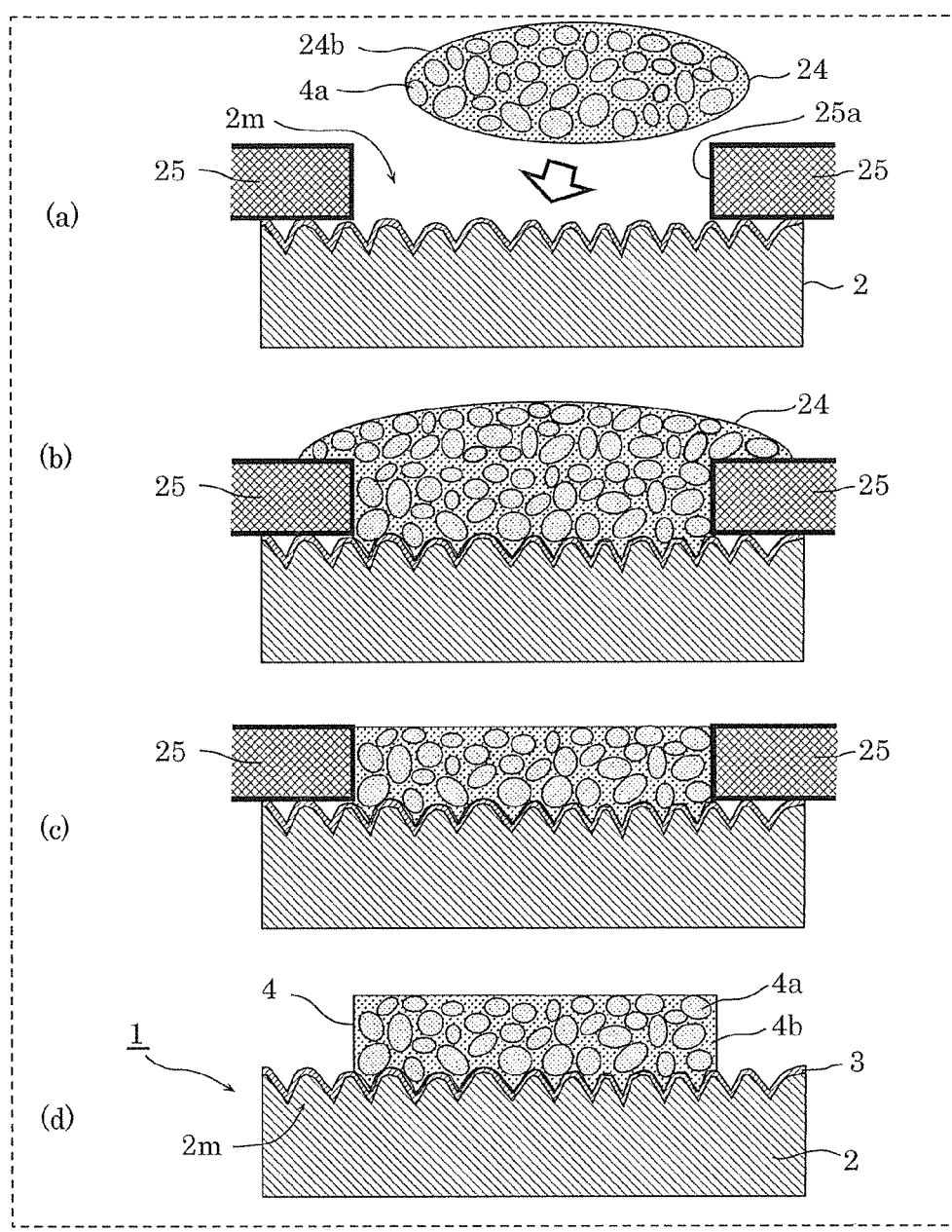
FIG. 7 is a schematic cross-sectional view illustrating a step of forming a wavelength conversion member in the process of manufacturing the wavelength conversion element according to Embodiment 1.

FIG. 7 is a schematic cross-sectional view illustrating the steps of forming wavelength conversion member 4 in the process of manufacturing wavelength conversion element 1 according to the present embodiment.

A step of forming support member 2 including depressions and projections having inclinations 2a using crystalline substrate 20 will be first described. Here, an example in which a silicon substrate is used as crystalline substrate 20 will be described.

As illustrated in cross-sectional view (a) of FIG. 6, first, crystalline substrate 20 having first crystal face 22a as a main surface is prepared. At this time, first crystal face 22a corresponds to the plane direction <100> of silicon.

In the next step, as illustrated in cross-sectional view (b) of FIG. 6, a silicon oxide film or etching mask 21 on the main surface is patterned, and a plurality of second crystal faces 22b is exposed from the main surface of crystalline substrate 20 by anisotropy etching. At this time, depressed portions 23 having second crystal faces 22b as lateral surfaces are formed on the main surface of crystalline substrate 20. A preferred anisotropy etching process is wet etching using an aqueous solution, such as tetramethylammonium hydroxide (TMAH) or potassium hydroxide (KOH). Second crystal faces 22b of the silicon substrate defined by the plane direction <111> can be exposed by such a wet etching process. At this time, it is preferred that a face having the same crystal face as that of the main surface be not formed on the bottom surfaces of depressed portions 23.

Subsequently, as illustrated in cross-sectional view (c) of FIG. 6, etching mask 21 is removed with hydrofluoric acid. Here, as illustrated in partially enlarged view C1 of cross-sectional view (c) of FIG. 6, depressed portion 23 is formed of a combination of planes. Vertex portions 22t formed between depressed portions 23 are flat surfaces formed of first crystal face 22a. Because incident light 82, without being scattered, is reflected by such flat surfaces in the case where vertex portions 22t are irradiated with incident light 82, stray light may be generated. To solve such a problem, as illustrated in cross-sectional view (d) of FIG. 6, the edges of depressed portions 23 of crystalline substrate 20 are removed by etching to form depressed portions 2c formed of curved faces. Thereby, as illustrated in partially enlarged view D1 of cross-sectional view (d) of FIG. 6, depressions and projections having inclinations 2a formed of curved faces are formed. The depressions and projections include vertex portions 2t having a curvature, and depressed portions 2c formed of curved faces. Here, use of an isotropic etching process as etching is preferred. Examples of usable isotropic etching processes include a process of performing wet etching using a mixed solution of hydrofluoric acid and nitric acid, and a process of performing dry etching. Depressed portions 2c having a curvature may be formed by the isotropic etching process in this step. Vertex portions 2t may have a curvature of about 1 μm or more and 10 μm or less, for example. Bottoms 2b of depressed portions 2c may also have a curvature as in vertex portions 2t.

As described above, support member 2 according to the present embodiment can be formed.

Subsequently, as illustrated in cross-sectional view (e) of FIG. 6, for example, silver alloy or aluminum is deposited on the depressions and projections having inclinations 2a of support member 2 to form reflective film 3. Here, reflective film 3 may include a metal film of silver alloy or aluminum, and an oxidation protective film of $SiO_2$ disposed on the metal film.

A step of forming wavelength conversion member 4 on support member 2 will now be described with reference to FIG. 7.

As illustrated in cross-sectional view (a) of FIG. 7, mask 25 with openings having predetermined openings 25a is first disposed on supporting surface 2m of support member 2. At this time, wavelength conversion member 4 can be formed into a desired shape by forming openings 25a according to the desired shape of wavelength conversion member 4. The thickness of mask 25 with openings can be set according to the desired thickness of wavelength conversion member 4. Subsequently, fluorescent substance-containing material 24 containing a mixture of fluorescent material 4a and liquid binder material 24b is injected into openings 25a of mask 25 with openings.

Subsequently, as illustrated in cross-sectional view (b) of FIG. 7, fluorescent substance-containing material 24 is disposed such that openings 25*a* are sufficiently filled with fluorescent substance-containing material 24. In other words, fluorescent substance-containing material 24 is injected into openings 25*a* to an extent such that fluorescent substance-containing material 24 overflows from openings 25*a*.

As illustrated in cross-sectional view (c) of FIG. 7, fluorescent substance-containing material 24 overflowing openings 25*a* is then removed.

As illustrated in cross-sectional view (d) of FIG. 7, support member 2 including fluorescent substance-containing material 24 on supporting surface 2*m* is then heated in a high temperature furnace to cure liquid binder material 24*b* in fluorescent substance-containing material 24. Thereby, wavelength conversion member 4 is formed. In the present embodiment, openings 25*a* have a diameter smaller than the width of support member 2. Such a configuration can achieve wavelength conversion member 4 having width W3 smaller than width W1 of support member 2 as illustrated in FIG. 1.

In the present embodiment, liquid binder material 24*b* to be used can be silsesquioxane dissolved in an organic solvent, for example.

After the curing of liquid binder material 24*b* in fluorescent substance-containing material 24, wavelength conversion member 4 may be wet etched to form projecting portions formed of a fluorescent material on the surface of wavelength conversion member 4 and depressed portions formed of transparent binder 4*b*.

Wavelength conversion element 1 including depressions and projections having inclinations 2*a* in support member 2 can be readily manufactured by the manufacturing process described above. Because a layer of a particulate material having a high refractive index is not included between wavelength conversion member 4 and support member 2 in the present embodiment, heat generated in wavelength conversion member 4 can be efficiently dissipated to support member 2.

The advantageous effects of wavelength conversion element 1 according to the present embodiment will now be described based on the experimental data.

Figure 8:
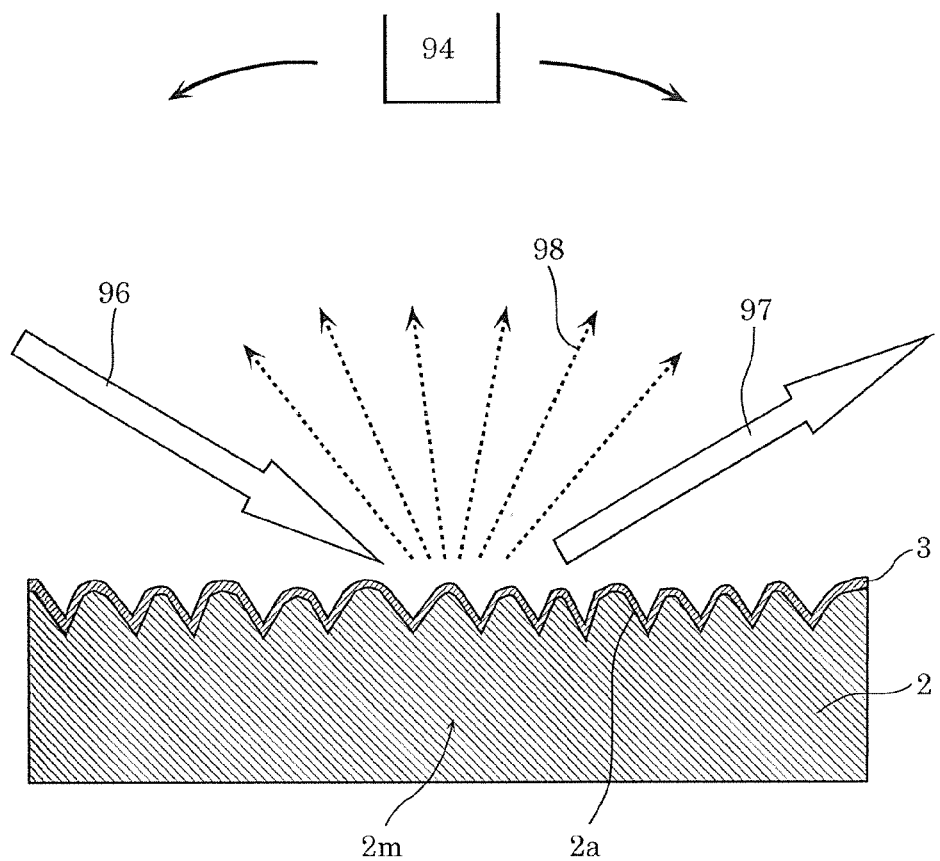
FIG. 8 is a diagram schematically illustrating a measurement system used in an experiment to verify the advantageous effects of the wavelength conversion element according to Embodiment 1.

FIG. 8 is a diagram schematically illustrated in a measurement system used in an experiment to verify the advantageous effects of wavelength conversion element 1 according to the present embodiment.

Figure 9:
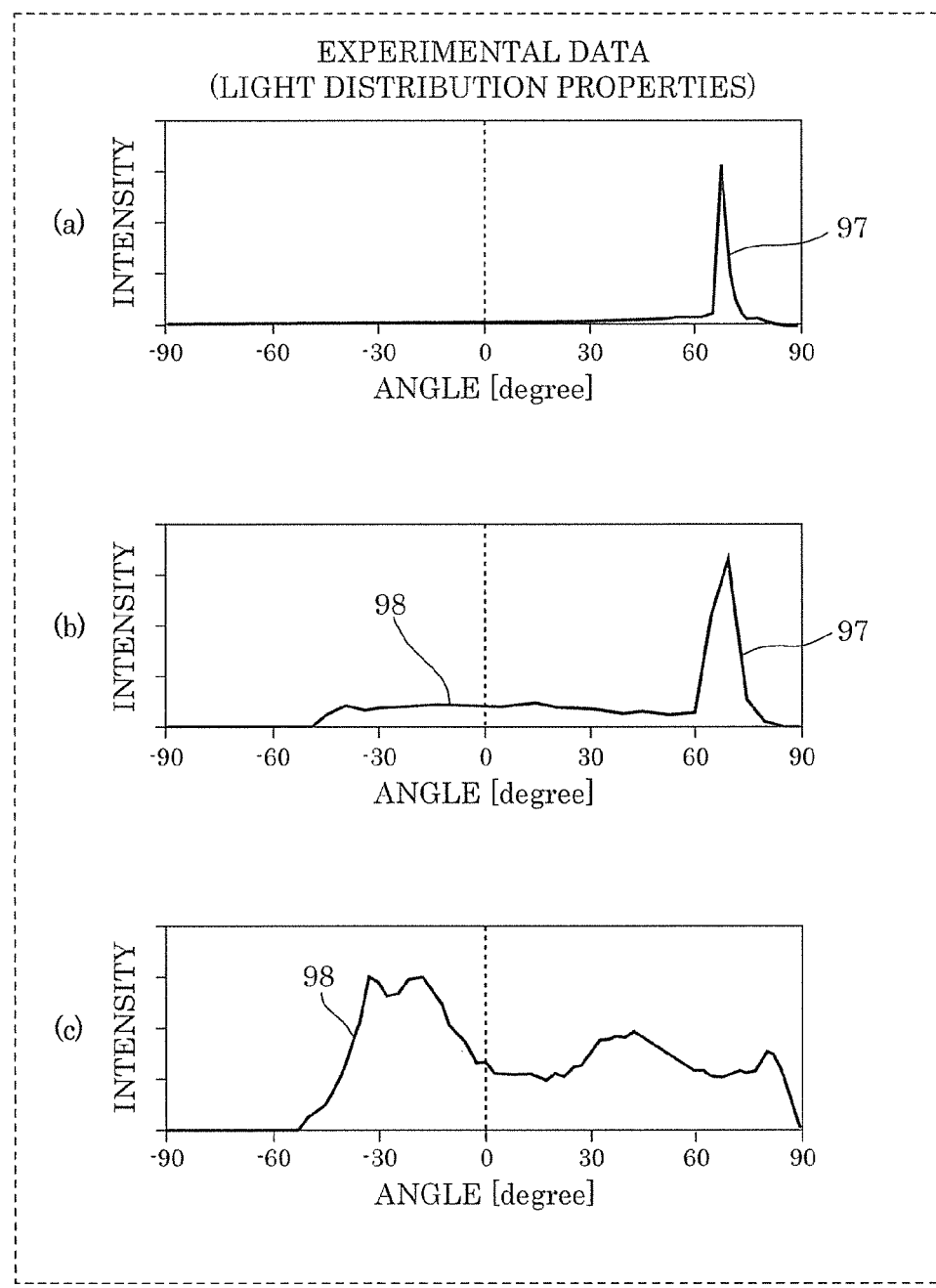
FIG. 9 shows graphs of the results of the experiment to verify the advantageous effects of the wavelength conversion element according to Embodiment 1.

FIG. 9 shows graphs of the results of the experiment to verify the advantageous effects of wavelength conversion element 1 according to the present embodiment.

As illustrated in FIG. 8, laser light or incident light 96 entered supporting surface 2*m* of support member 2 having inclinations 2*a*, and the emitting direction angle dependency of reflected light was measured with detector 94. In the case where the incident surface which incident light 96 enters is mainly formed of a plane, for example, among the components of incident light 96, components reflected on the incident surface at a reflection angle identical with the angle of incidence (that is, reflected light 97 illustrated in FIG. 8) are dominant in the measurement system as illustrated in FIG. 8. In contrast, in the case where the incident surface has fine depressions and projections, scattered light 98 or scattered reflected light illustrated in FIG. 8 is dominant.

The measurement was performed with the measurement system illustrated in FIG. 8 where the surface state (state of supporting surface 2*m*) of the support member was varied as the following three states:
(a) A surface state of a silicon substrate not processed (surface state where the crystal face is kept),
(b) A surface state of a silicon substrate having depressions and projections formed by grinding on the surface, and
(c) A surface state of support member 2 according to the present embodiment (that is, a surface state having depressions and projections having inclinations 2*a*)

The measurement was performed using support members having these surface states (a), (b), and (c), and the results are shown in graphs (a), (b), and (c) of FIG. 9, respectively. In each of the graphs of FIG. 9, the abscissa represents the emitting direction angle, and the ordinate represents the intensity of reflected light.

As shown in graph (a) of FIG. 9, only reflected light 97 having high directivity was observed in the surface state of the silicon substrate not processed.

As shown in graph (b) of FIG. 9, it turned out that in the surface state of the silicon substrate having depressions and projections formed by grinding the surface, reflected light 97 keeping directivity (that is, not scattered) is dominant although scattered light 98 is observed. In other words, the result shows an insufficient scattering effect by the depressions and projections formed on the surface of the silicon substrate.

As shown in graph (c) of FIG. 9, only scattered light 98 was observed, but not reflected light 97, in the surface state of support member 2 according to the present embodiment.

Thus, the depressions and projections having inclinations 2*a* in support member 2 according to the present embodiment provide a sufficient scattering effect. Among the depressions and projections having inclinations 2*a*, the depressions and projections formed by grinding have a higher scattering effect. It is believed that this higher scattering effect is attributed to the differences between the shape and dimension of depressions and projections having inclinations 2*a* in support member 2 and those of the depressions and projections formed by grinding. In other words, while the depressed portions of the depressions and projections formed by grinding have a depth in the order of nanometer, depressed portions 2*c* of the depressions and projections having inclinations 2*a* in support member 2 have a depth of 1 μm or more and 4 μm or less in terms of a peak-to-valley value in a 50 μm square region. The ratio of the depth to the width of depressed portions 2*c* is 0.1 or more and 1 or less.

By use of the manufacturing method according to the present embodiment, depressions and projections which can sufficiently scatter incident light 82 can be readily formed around wavelength conversion member 4 on supporting surface 2*m* of support member 2 of wavelength conversion element 1. As a result, a reduction in conversion efficiency of the wavelength conversion member caused by an increased temperature of wavelength conversion member 4 can be prevented, and efficient scattering of incident light not radiated to wavelength conversion member 4 can be achieved, efficiently emitting emitted light from wavelength conversion member 4.

Other effects of wavelength conversion element 1 according to the present embodiment will now be described with reference to the drawings.

Figure 10:
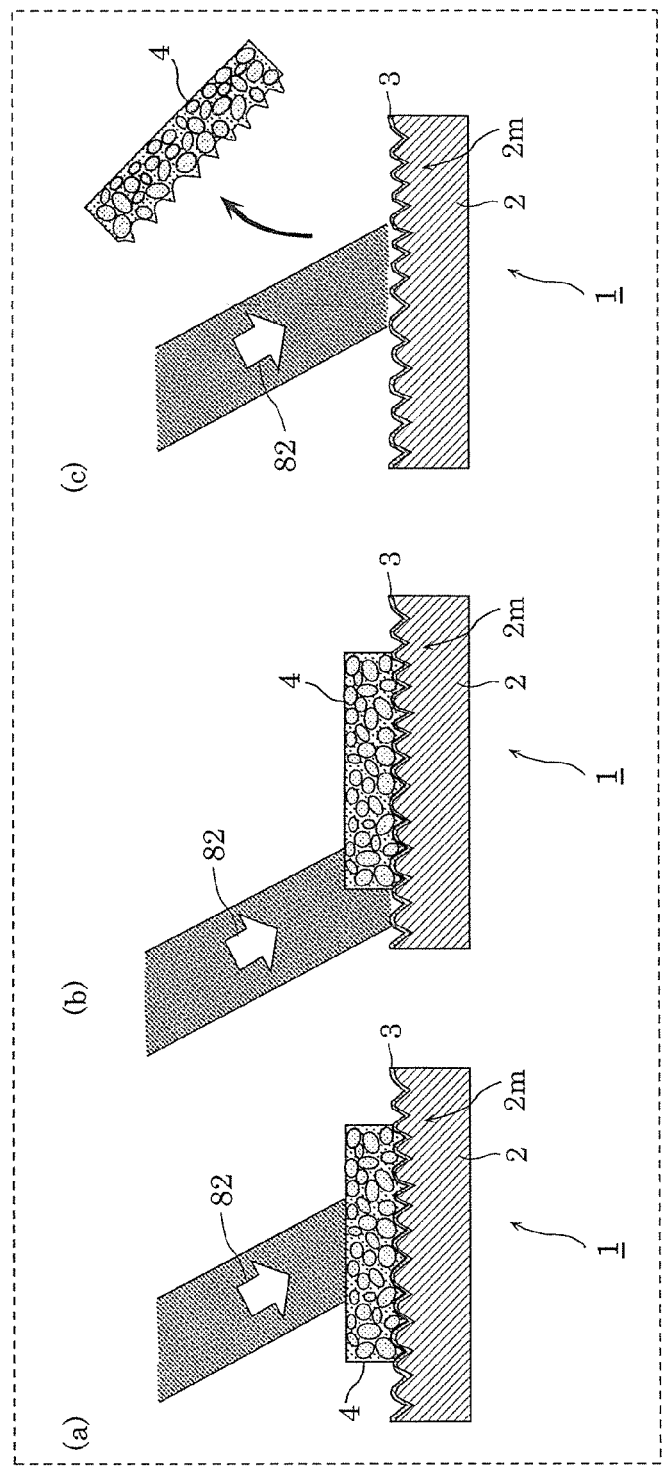
FIG. 10 is a schematic cross-sectional view illustrating other effects of the wavelength conversion element according to Embodiment 1.

FIG. 10 is a schematic cross-sectional view illustrating other effects of wavelength conversion element 1 according to the present embodiment.

As illustrated in cross-sectional view (a) of FIG. 10, in wavelength conversion element 1 according to the present embodiment, depressions and projections are formed not only on light scattering portion 2*s* of support member 2 but also in arrangement region 2*p*. Wavelength conversion member 4 is disposed on arrangement region 2*p* where the depressions and projections are formed. Cross-sectional view (a) of FIG. 10 illustrates a state where incident light 82 or blue laser light enters wavelength conversion element 1, for example. The irradiation region of incident light 82 is defined such that most of incident light 82 is radiated to wavelength conversion member 4. Unfortunately, a positional deviation between the excitation light source (not illustrated) which generates incident light 82 and wavelength conversion element 1 may occur during assembly or over time. Cross-sectional view (b) of FIG. 10 illustrates a relative positional deviation between incident light 82 and wavelength conversion member 4. In this case, although incident light 82 is radiated to the surface (supporting surface 2m) of support member 2 in wavelength conversion element 1, incident light 82 keeping directivity is not reflected on support member 2, as described above, because support member 2 has the depressions and projections which performs diffusion reflection on incident light 82. As a result, such a light emitting device including wavelength conversion element 1 does not emit reflected light 97 keeping directivity illustrated in FIG. 8, ensuring safety also in lighting apparatuses and devices which illuminate people.

As illustrated in cross-sectional view (c) of FIG. 10, wavelength conversion member 4 may be detached from support member 2 by vibration or impact applied to wavelength conversion element 1 during use. In this case, because incident light 82 is sufficiently scattered by the surface of support member 2, the safety can also be ensured as in the case of cross-sectional view (b) of FIG. 10.

Although blue light having a center wavelength of 420 nm to 490 nm is used as incident light and a YAG fluorescent substance is used as the fluorescent material in the configuration described above, any combination of types of incident light and fluorescent material can be used. For example, in the case where blue light is used as incident light, an Eu-doped α-SiAlON fluorescent substance or an Eu-doped (Ba, Sr)Si$_2$O$_2$N$_2$ fluorescent substance which emits yellow light can be used as fluorescent material 4a. In the case where near-ultraviolet light having a wavelength of 380 nm to 420 nm is used as incident light, wavelength conversion member 4 may be formed by mixing or laminating a blue fluorescent substance which emits blue fluorescence and a yellow fluorescent substance which emits yellow fluorescence.

Wavelength conversion element 1 according to the present embodiment can have any configuration other than the configuration described above. For example, the formation of reflective film 3 across the entire supporting surface 2m is optional. As a wavelength conversion element according to Modification 1 of the present embodiment, a wavelength conversion element including reflective film 3 only in arrangement region 2p of supporting surface 2m will now be described with reference to the drawings.

Figure 11:
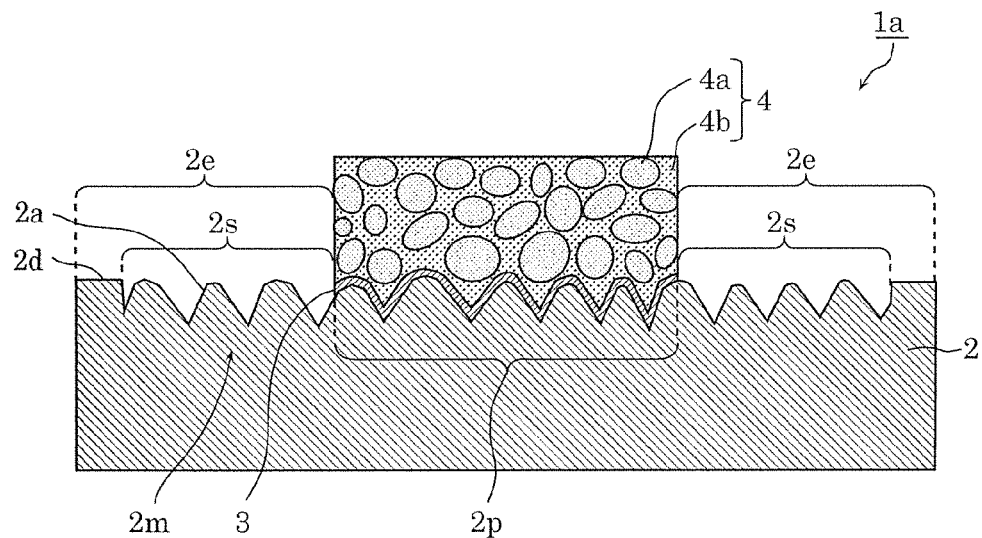
FIG. 11 is a schematic cross-sectional view illustrating a configuration of the wavelength conversion element according to Modification 1 of Embodiment 1.

FIG. 11 is a schematic cross-sectional view illustrating a configuration of wavelength conversion element 1a according to the present modification.

As illustrated in FIG. 11, in wavelength conversion element 1a according to the present modification, the reflective film is not formed in outer peripheral region 2e of supporting surface 2m, and is formed only in arrangement region 2p immediately under wavelength conversion member 4. In this case, silicon is exposed. Silicon has a reflectance of 40% to incident light 82 (excitation light 81) having a wavelength of 450 nm. For this reason, part of incident light 82, i.e., peripheral light components 82b directly enter surface (i.e., supporting surface 2m) of support member 2. In this case, peripheral light components 82b are scattered by depressions and projections having inclinations 2a in light scattering portion 2s, and part of peripheral light components 82b is absorbed by support member 2 formed of silicon. In the present modification, the absorption coefficient of excitation light in light scattering portion 2s is larger than the absorption coefficient of excitation light in arrangement region 2p. For this reason, light scattering portion 2s functions as a light absorbing portion which can absorb excitation light or peripheral light components 82b. Accordingly, the present modification can more significantly reduce the generation of stray light. The present modification can efficiently dissipate heat generated by absorption of peripheral light components 82b, because support member 2 includes silicon having high thermal conductivity as a member used.

In the present modification, the absorption coefficient of excitation light in light scattering portion 2s is larger than the absorption coefficient of excitation light in arrangement region 2p, and the absorption coefficient of excitation light in light scattering portion 2s may be at least equal to the absorption coefficient of excitation light in arrangement region 2p.

A wavelength conversion element according to Modification 2 of the present embodiment will now be described with reference to the drawing.

Figure 12:
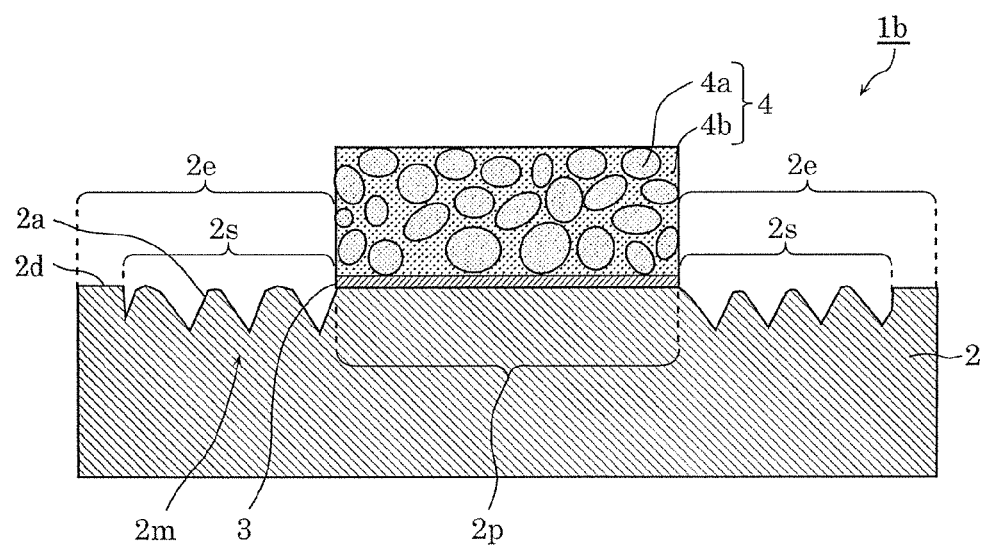
FIG. 12 is a schematic cross-sectional view illustrating a configuration of a wavelength conversion element according to Modification 2 of Embodiment 1.

FIG. 12 is a schematic cross-sectional view illustrating a configuration of wavelength conversion element 1b according to the present modification.

As illustrated in FIG. 12, in wavelength conversion element 1b according to the present modification, depressions and projections having inclinations 2a are formed only in light scattering portion 2s in outer peripheral region 2e of supporting surface 2m but not in arrangement region 2p. In other words, in the present modification, light scattering portion 2s has a surface roughness at least equal to that of arrangement region 2p. Also in this case, incident light which enters wavelength conversion member 4 is scattered by fluorescent material 4a, and the emission of incident light which is not scattered is prevented.

In the present modification, reflective film 3 is formed only in arrangement region 2p as in wavelength conversion element 1a according to Modification 1 above. Accordingly, the present modification can achieve the same effects as in Modification 1.

A wavelength conversion element according to Modification 3 of the present embodiment and a light emitting device including the wavelength conversion element will now be described with reference to the drawings.

Figure 13:
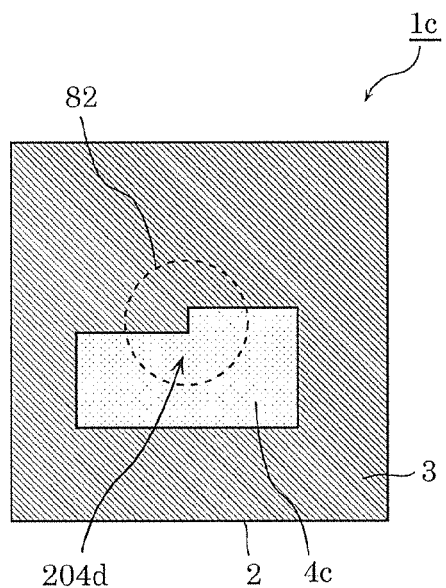
FIG. 13 is a schematic plan view illustrating a configuration of a wavelength conversion element according to Modification 3 of Embodiment 1.

FIG. 13 is a schematic plan view illustrating a configuration of wavelength conversion element 1c according to the present modification. FIG. 13 illustrates a plan view of supporting surface 2m of wavelength conversion element 1c in a top surface view of supporting surface 2m. A circle represented by the dashed line illustrated in FIG. 13 indicates the irradiation region of incident light 82.

Figure 14:
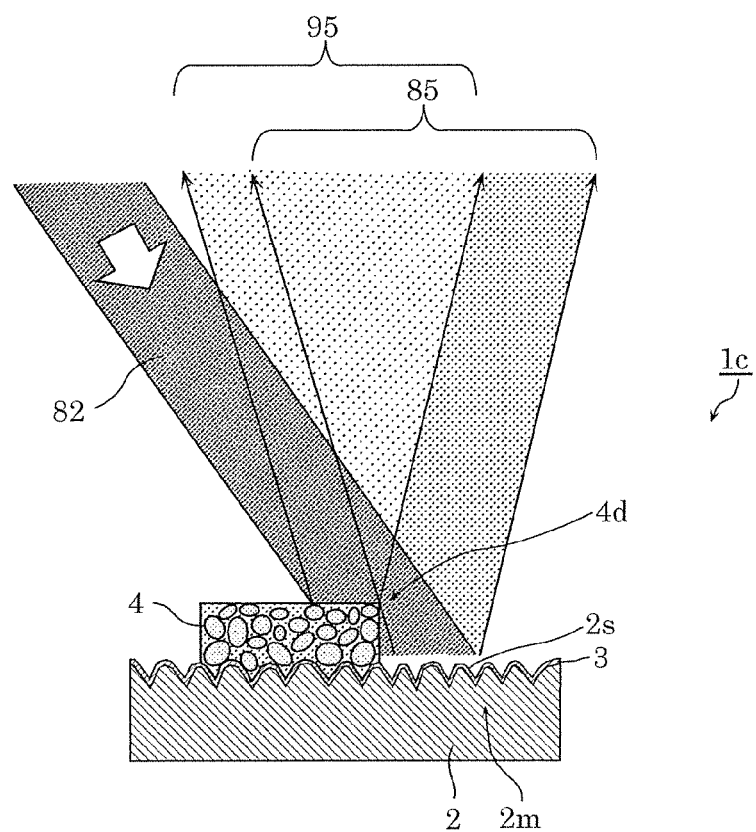
FIG. 14 is a schematic cross-sectional view illustrating a positional relation between the wavelength conversion element according to Modification 3 of Embodiment 1 and incident light.

FIG. 14 is a schematic cross-sectional view illustrating a positional relation between wavelength conversion element 1c according to the present modification and incident light 82.

Figure 15:
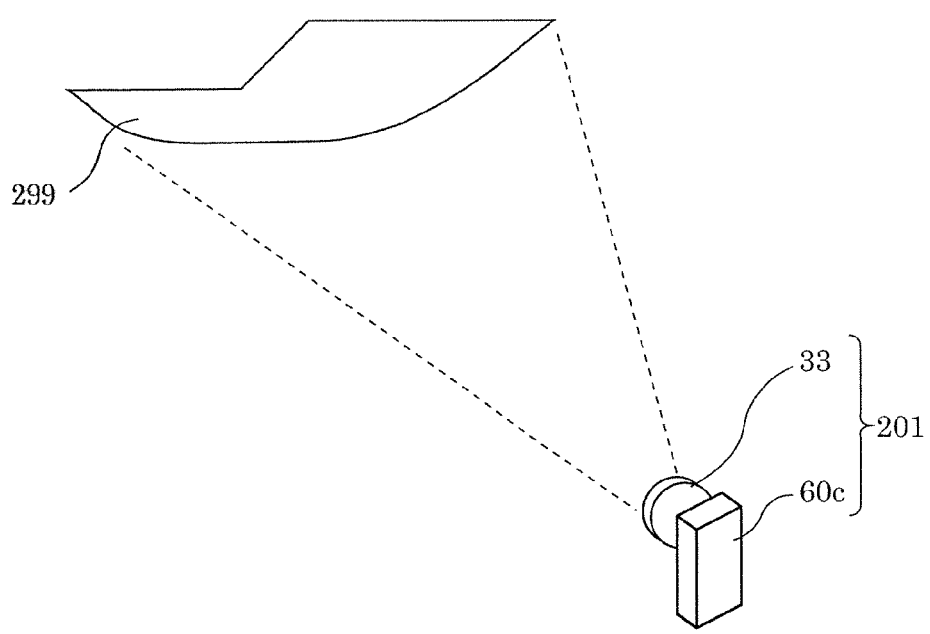
FIG. 15 is a schematic perspective view illustrating a light projector including the wavelength conversion element according to Modification 3 of Embodiment 1 and the projected light therefrom.

FIG. 15 is a schematic perspective view illustrating light projector 201 including wavelength conversion element 1c according to the present modification and projected light 299 therefrom.

Wavelength conversion element 1c according to the present modification and light projector 201 including wavelength conversion element 1c are used in headlamps for vehicles. In the present modification, wavelength conversion member 4c disposed on support member 2 is patterned into a hook shape as illustrated in FIG. 13. At this time, pattern 204d corresponding to cutoff points of headlamps for vehicles is formed on wavelength conversion member 4c. As indicated by the circle represented by the dashed line in FIG. 13, the irradiation region of incident light 82 in wavelength conversion element 1c includes part of wavelength conversion member 4c such that pattern 204d of wavelength conversion member 4c is located near the center of the irradiation region. At this time, as illustrated in FIG. 14, incident light 82 radiated to wavelength conversion member 4c is emitted from wavelength conversion member 4c as white light, i.e., emitted light 95. In contrast, incident light 82 radiated to the surface (light scattering portion 2s of supporting surface 2m) of support member 2 is emitted as scattered light 85 having the same spectrum as that of incident light 82. In other words, scattered light 85 having low luminosity factor and low luminance is emitted from the surface of support member 2.

Here, light emitting device 60c including wavelength conversion element 1c according to the present modification and projected light 299 emitted from light projector 201 including projecting member 33, such as a projection lens, will be described with reference to FIG. 15. As illustrated in FIG. 15, projected light 299 emitted from light projector 201 is white light having a clear cutoff pattern.

Use of wavelength conversion element 1c according to the present modification can achieve light emitting device 60c and light projector 201 having high luminance and enabling easy patterning of projected light.

Embodiment 2

A wavelength conversion element according to Embodiment 2 will now be described. The wavelength conversion element according to the present embodiment includes a light scattering portion having a configuration different from that of wavelength conversion element 1 according to Embodiment 1. Differences between the wavelength conversion element according to the present embodiment and wavelength conversion element 1 according to Embodiment 1 will be mainly described with reference to FIG. 16.

Figure 16:
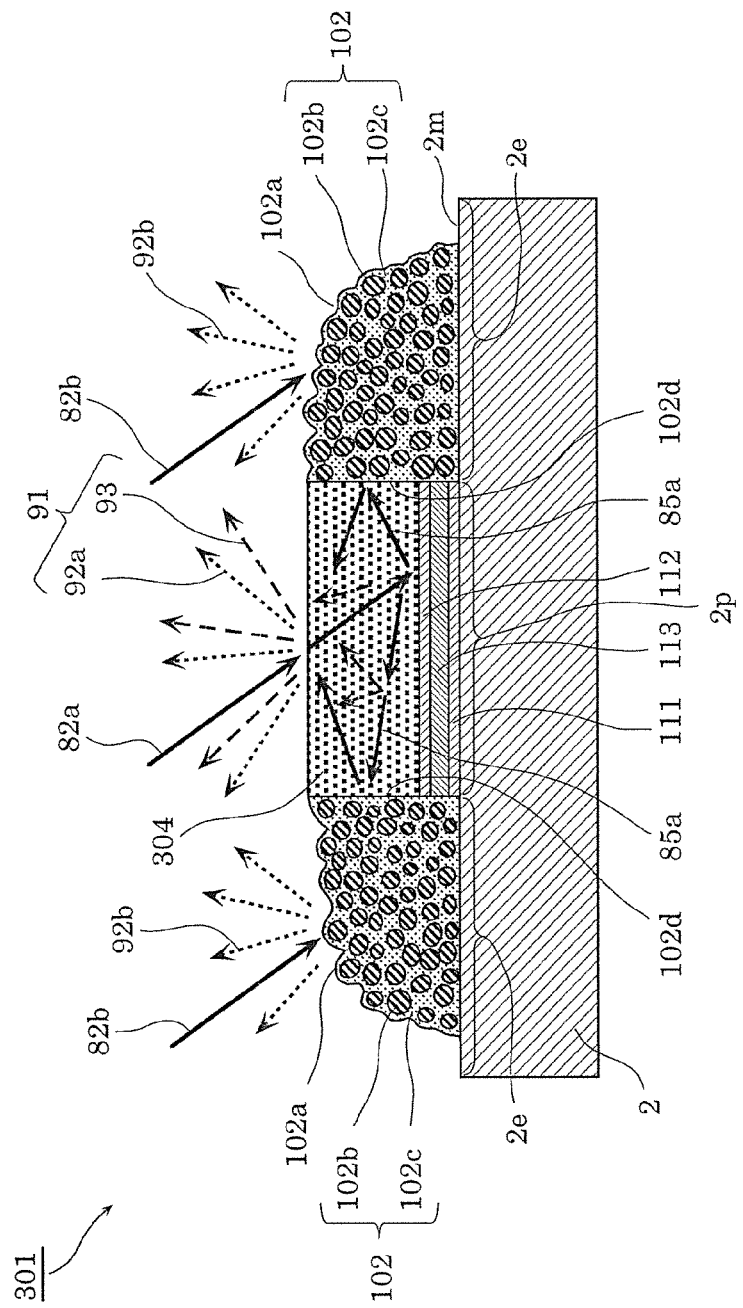
FIG. 16 is a schematic cross-sectional view illustrating a configuration of a wavelength conversion element according to Embodiment 2.

FIG. 16 is a schematic cross-sectional view illustrating a configuration of wavelength conversion element 301 according to the present embodiment.

As illustrated in FIG. 16, wavelength conversion element 301 mainly includes support member 2, wavelength conversion member 304, and scattering member 102. In wavelength conversion element 301, wavelength conversion member 304 formed of a fluorescent ceramic plate is disposed on supporting surface 2m of support member 2. Wavelength conversion member 304 is formed of a fluorescent plate formed by mixing $Al_2O_3$ and Ce-doped $(Ga, Y, Gd)_3Al_5O_{10}$ and sintering the mixture, for example. The central portion of supporting surface 2m of support member 2 includes undercoating 111 formed of a laminate film of a metal such as Ti, Pt, or Au. Reflective film 112, which is a reflective member formed of a laminate film of a metal, such as Pt, Ag, Ti, Pt, or Au, is disposed on the surface of wavelength conversion member 304 facing support member 2. Wavelength conversion member 304 is fixed to support member 2 by bonding undercoating 111 to reflective film 112 with bonding layer 113 formed of a soldering material, such as an AuSn alloy, for example.

Scattering member 102 is disposed in outer peripheral region 2e of supporting surface 2m so as to surround wavelength conversion member 304. Scattering member 102 is formed by dispersing particles 102b of $TiO_2$, $ZrO_2$, $Al_2O_3$, BN, or AlN having a high refractive index in transparent binder 102c formed of a material, such as silicone or a glass material, having a refractive index lower than that of particles 102b having a high refractive index, for example. Fine depressions and projections 102a are formed on the surface of scattering member 102. In the present embodiment, the light scattering portion is scattering member 102 disposed on supporting surface 2m and containing particles 102b having a high refractive index and transparent binder 102c. In other words, scattering member 102 is one example of the first scattering member described above. At this time, as in Embodiment 1, the total length of scattering member 102 and arrangement region 2p in a direction parallel to supporting surface 2m is preferably $2.2 \times 2\omega_0$ or more where the diameter of incident light 82 is $2\omega_0$.

In the present embodiment, central light components 82a of incident light 82 are radiated to wavelength conversion member 304. Part of central light components 82a propagates through wavelength conversion member 304, undergoes multiple reflection by reflective film 112 disposed immediately under wavelength conversion member 304 and interface 102d between wavelength conversion member 304 and scattering member 102, and is converted into multiple reflection light 85a. Thereby, white light 91 formed of scattered light 92a and fluorescence 93 can be efficiently generated, and be emitted from wavelength conversion member 304.

Furthermore, peripheral light components 82b of incident light 82 are radiated to scattering member 102. Peripheral light components 82b are scattered or totally reflected by fine depressions and projections 102a on the surface of scattering member 102 and particles 102b having a high refractive index of scattering member 102, and are emitted from wavelength conversion element 301 as scattered light 92b. In such a configuration, part of incident light 82 which enters from the outside of wavelength conversion element 301 and is radiated to portions other than wavelength conversion member 304 can be also scattered by the surface of scattering member 102 disposed around wavelength conversion member 304. For this reason, even in the case where incident light 82 or excitation light having high directivity enters wavelength conversion element 301, the reflection of incident light 82 on support member 2 while keeping directivity can be prevented. As a result, the emission of unnecessary stray light having high directivity from wavelength conversion element 301 can be prevented. Furthermore, even when some components of incident light which enter wavelength conversion member 304 reach the lateral surfaces of wavelength conversion member 304, these components are again reflected in wavelength conversion member 304 by interface 102d with scattering member 102 disposed on the lateral surfaces of wavelength conversion member 304. For this reason, incident light 82 can be efficiently converted into fluorescence within wavelength conversion member 304. As a result, emitted light having high luminance can be emitted from wavelength conversion member 304.

Although the surface of scattering member 102, that is, the interface between scattering member 102 and its surrounding air has depressions and projections in the present modification, the surface of scattering member 102 may have no depressions and projections. For example, inside scattering member 102, depressions and projections are formed at the interface between particles 102b having a high refractive index and transparent binder 102c along the shapes of particles 102b having a high refractive index.

Accordingly, scattering member 102 has depressions and projections at the interface between particles 102b having a high refractive index and transparent binder 102c, and incident light which enter the inside of scattering member 102 is scattered by the depressions and projections.

A wavelength conversion element according to Modification 1 of the present embodiment will now be described. Unlike wavelength conversion element 301 according to Embodiment 2, the wavelength conversion element according to the present modification also includes scattering member 102 in arrangement region 2p of supporting surface 2m. Differences between the wavelength conversion element according to the present modification and wavelength conversion element 301 according to Embodiment 2 will be mainly described with reference to the drawing.

Figure 17:
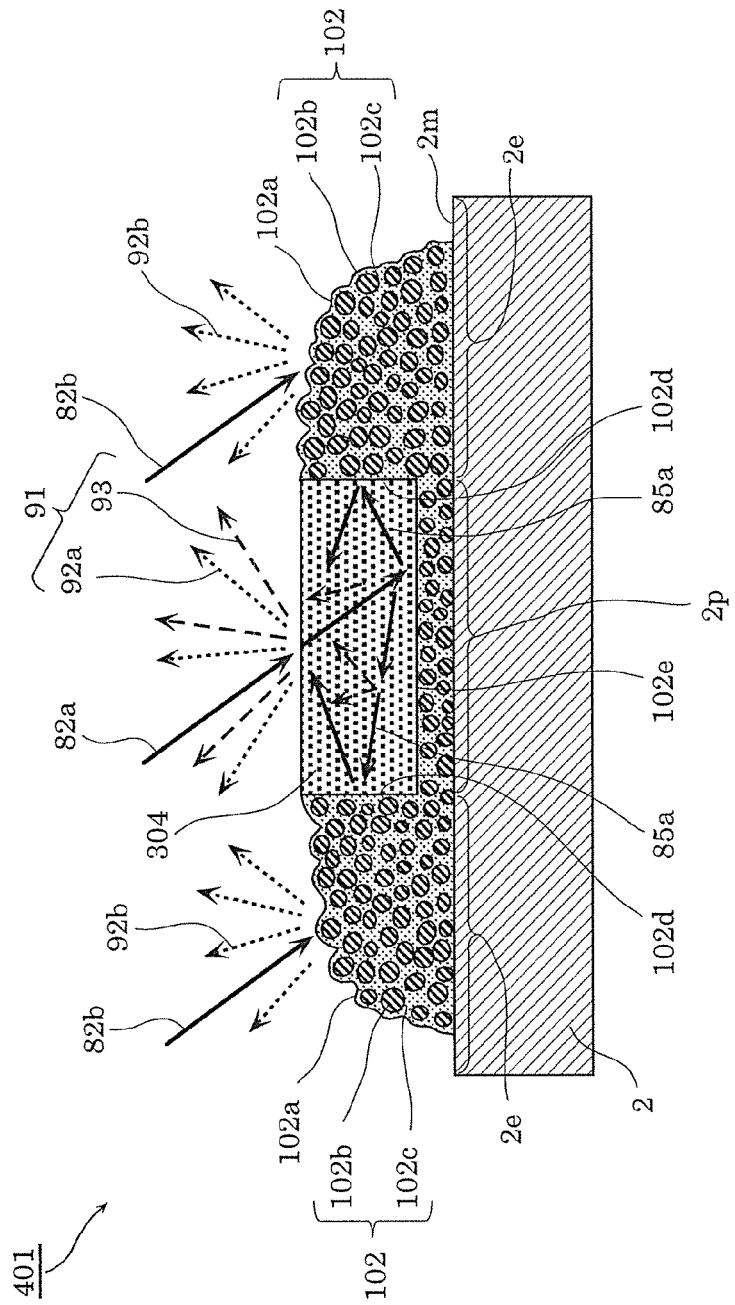
FIG. 17 is a schematic cross-sectional view illustrating a configuration of a wavelength conversion element according to Modification 1 of Embodiment 2.

FIG. 17 is a schematic cross-sectional view illustrating a configuration of wavelength conversion element 401 according to the present modification.

As illustrated in FIG. 17, in wavelength conversion element 401 according to the present modification, scattering member 102 is also disposed in arrangement region 2p. In other words, scattering member 102 covers all of surfaces of wavelength conversion member 304 disposed in arrangement region 2p excluding the surface which incident light 82 enters (upper surface of FIG. 17), i.e., the lateral surfaces and the surface facing support member 2. In other words, scattering member 102 also functions as a reflective member which is disposed between wavelength conversion member 304 and support member 2 and is different from support member 2. In short, scattering member 102 is one example of the second scattering member described above. For this reason, part of incident light 82 which enters wavelength conversion member 304 can be subjected to multiple reflection by interface 102d between wavelength conversion member 304 and scattering member 102 disposed in outer peripheral region 2e and interface 102e between wavelength conversion member 304 and scattering member 102 disposed between wavelength conversion member 304 and support member 2. Thus, white light 91 can be efficiently emitted from wavelength conversion member 304.

The advantageous effect of the wavelength conversion elements according to the present embodiment and Modification 1 of the present embodiment will now be described with reference to the drawings.

Figure 18A:
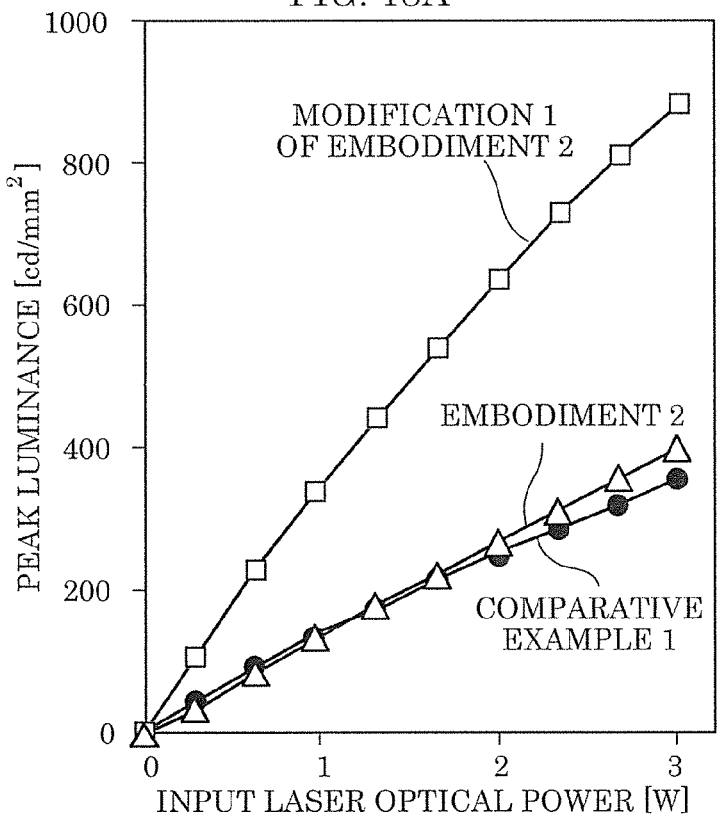
FIG. 18A is a graph illustrating the relation between the measured value of the power of incident light and the measured value of the peak luminance of emitted light in the wavelength conversion element according to Embodiment 2 and the wavelength conversion element according to Modification 1 of Embodiment 2.

FIG. 18A is a graph showing the relation between the measured power of incident light and the measured peak luminance of emitted light in wavelength conversion element 301 according to the present embodiment and wavelength conversion element 401 according to Modification 1 of the present embodiment. FIG. 18A also shows the relation between the measured power of incident light and the measured peak luminance of emitted light in the wavelength conversion element according to Comparative Example 1. In the wavelength conversion element according to Comparative Example 1, the lateral surfaces of wavelength conversion member 304 are not covered with a scattering member. In other words, the wavelength conversion element according to Comparative Example 1 has a structure of wavelength conversion element 301 according to Embodiment 2 illustrated in FIG. 16 from which scattering member 102 is removed. The comparison between Comparative Example 1 and Embodiment 2 shows that at a power of incident light of 2 W or more, scattering member 102 disposed around wavelength conversion member 304 can improve the peak luminance. Furthermore, the graph shows that irrespective of the power of incident light, the peak luminance can be significantly improved by scattering member 102 disposed on both of the lateral surfaces and the bottom surface of wavelength conversion member 304 as in wavelength conversion element 401 according to Modification 1 of Embodiment 2 illustrated in FIG. 17.

Figure 18B:
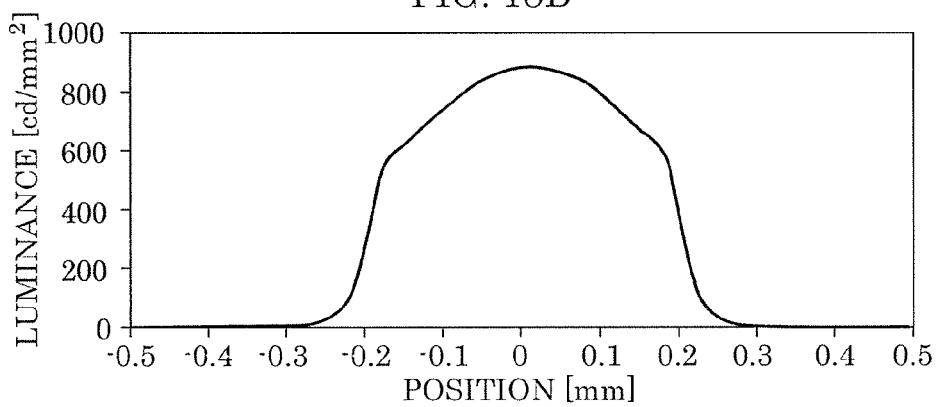
FIG. 18B is a luminance distribution chart showing the results of measurement of the luminance corresponding to each emission position of the emitted light from the wavelength conversion element in the case where the wavelength conversion element according to Modification 1 of Embodiment 2 is used and incident light has a power of 3 W.
Figure 18C:
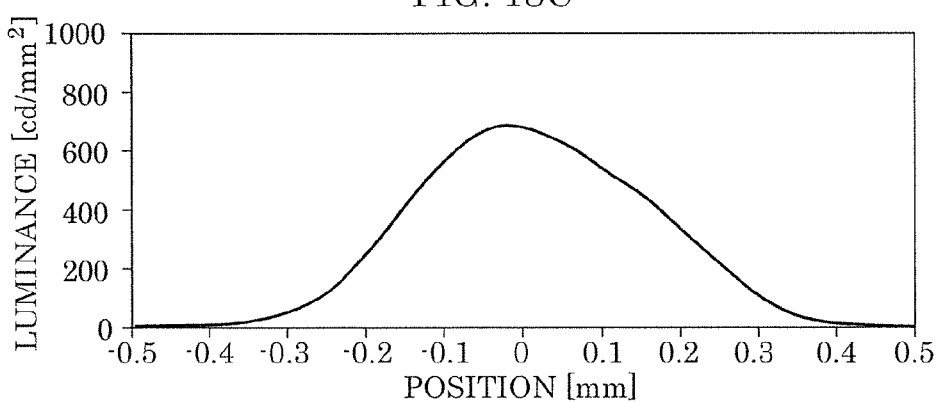
FIG. 18C is a luminance distribution chart showing the results of measurement of the luminance corresponding to each emission position of the emitted light from the wavelength conversion element in the case where a wavelength conversion element of Comparative Example 2 is used.
Figure 28A:
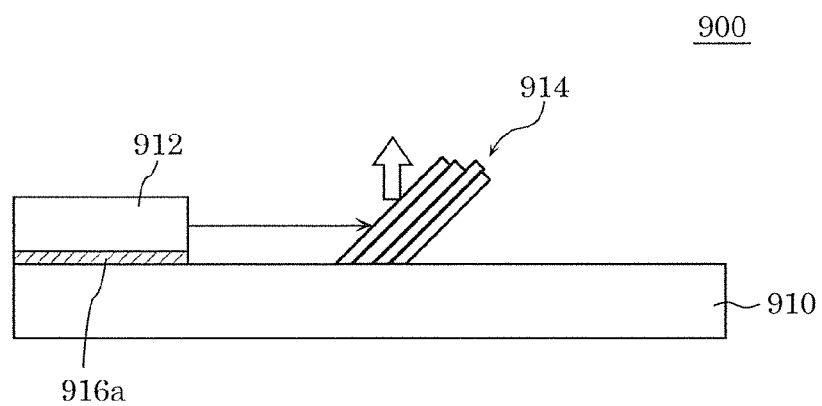
FIG. 28A is a side view illustrating a conventional light emitting device.
Figure 28B:
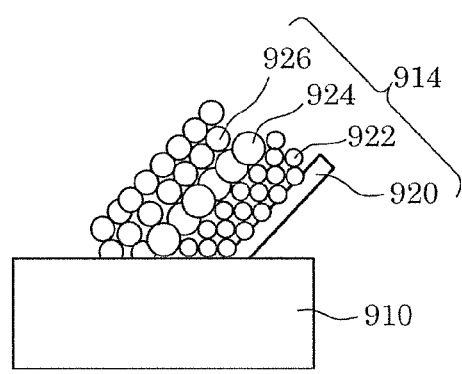
FIG. 28B is an enlarged view illustrating a conventional wavelength conversion element and a mount substrate.

FIG. 18B is a luminance distribution chart showing the results of measurement of the luminance of the emitted light of the wavelength conversion element according to the emission position in wavelength conversion element 401 according to Modification 1 of the present embodiment where the power of incident light is 3 W. FIG. 18C is a luminance distribution chart showing the results of measurement of the luminance of the emitted light of the wavelength conversion element according to the emission position in the wavelength conversion element of Comparative Example 2. Although the wavelength conversion element according to Comparative Example 2 has a configuration similar to that of the wavelength conversion element illustrated in FIG. 28B, width W3 of the wavelength conversion member is sufficiently larger than that of the wavelength conversion element according to Modification 1 of the present embodiment. In other words, the wavelength conversion member has a width sufficiently larger than the diameter of the incident light. At this time, compared to the luminance distribution illustrated in FIG. 18C, in the luminance distribution illustrated in FIG. 18B, a broad high luminance region is formed near the center of the emission region of the wavelength conversion element, and the luminance sharply decreases from the high luminance region toward the surrounding low luminance region. As described above, in Modification 1 of the present embodiment, a luminance distribution better than that of Comparative Example 2 can be achieved through adjustment of the width of the wavelength conversion member and the width of the incident light.

This is because in the case where wavelength conversion element 401 according to Modification 1 of the present embodiment is used, part of central light components 82a of incident light entering wavelength conversion member 304 is subjected to multiple reflection at interface 102d between wavelength conversion member 304 and scattering member 102 and at interface 102e between wavelength conversion member 304 and scattering member 102 disposed between wavelength conversion member 304 and support member 2 to uniformize light intensity distribution of central light components 82a within wavelength conversion member 304. In other words, a high luminance region having a shape corresponding to the shape in a top surface view of wavelength conversion member 304 is formed.

Accordingly, for example, in the case where light is projected from light projectors as illustrated in FIG. 15 using light emitting devices and projecting members including the wavelength conversion elements according to the present embodiment and Modification 1 thereof, light projectors having a high illuminance region corresponding to the shape of the wavelength conversion member and having a low illuminance in the surrounding region can be achieved. In other words, light projectors having excellent illuminance distribution properties can be achieved.

One example of a process of manufacturing wavelength conversion element 401 according to Modification 1 of the present embodiment will now be described with reference to the drawings.

Figure 19:
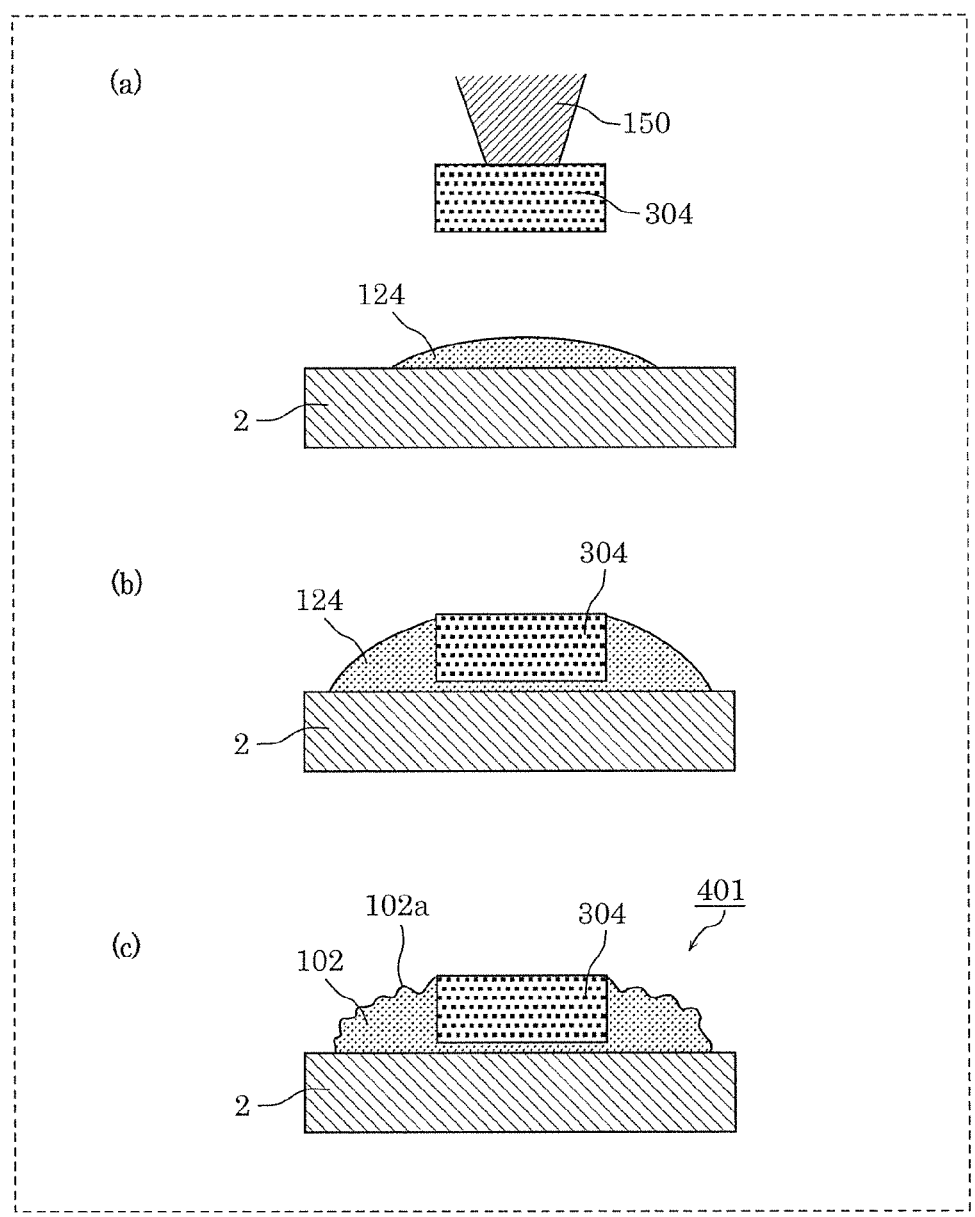
FIG. 19 is a schematic cross-sectional view illustrating steps in a process of manufacturing the wavelength conversion element according to Modification 1 of Embodiment 2.

FIG. 19 is a schematic cross-sectional view illustrating of the steps in the process of manufacturing wavelength conversion element 401 according to the present modification.

As illustrated in cross-sectional view (a) of FIG. 19, first, paste 124 for a scattering member prepared with a mixture of TiO₂ particles having a particle diameter distribution of 1 µm to 4 µm and a transparent binder is applied onto a silicon substrate or support member 2, for example. Here, the term "particle diameter distribution of 1 µm to 4 µm" indicates that the average particle size (median diameter) D50 is 2 µm, the average particle size D10 is 1 µm, and the average particle size D90 is 4 µm. At this time, the transparent binder to be used is a paste of transparent binder prepared by dissolving silsesquioxane in an organic solvent. Wavelength conversion member 304 is held with vacuum collet 150.

In the next step, as illustrated in cross-sectional view (b) of FIG. 19, wavelength conversion member 304 is placed on paste 124 for a scattering member. At this time, the intermolecular force acting between wavelength conversion member 304 and the transparent binder causes paste 124 for a scattering member to climb up on lateral surfaces of wavelength conversion member 304. For this reason, the bottom surface and lateral surfaces of wavelength conversion member 304 can be readily covered with paste 124 for a scattering member.

In the next step, as illustrated in cross-sectional view (c) of FIG. 19, the workpiece is heated at about 150° C. for two hours to volatilize the organic solvent in paste 124 for a scattering member and cure paste 124 for a scattering member. Thereby, scattering member 102 can be formed on the bottom surface and lateral surfaces of wavelength conversion member 304. At this time, because paste 124 for a scattering member contracts, depressions and projections can be readily formed along particles 102b having a high refractive index on the surface of scattering member 102.

A preferred embodiment of scattering member 102 according to the present embodiment will now be described with reference to the drawings.

Figure 20:
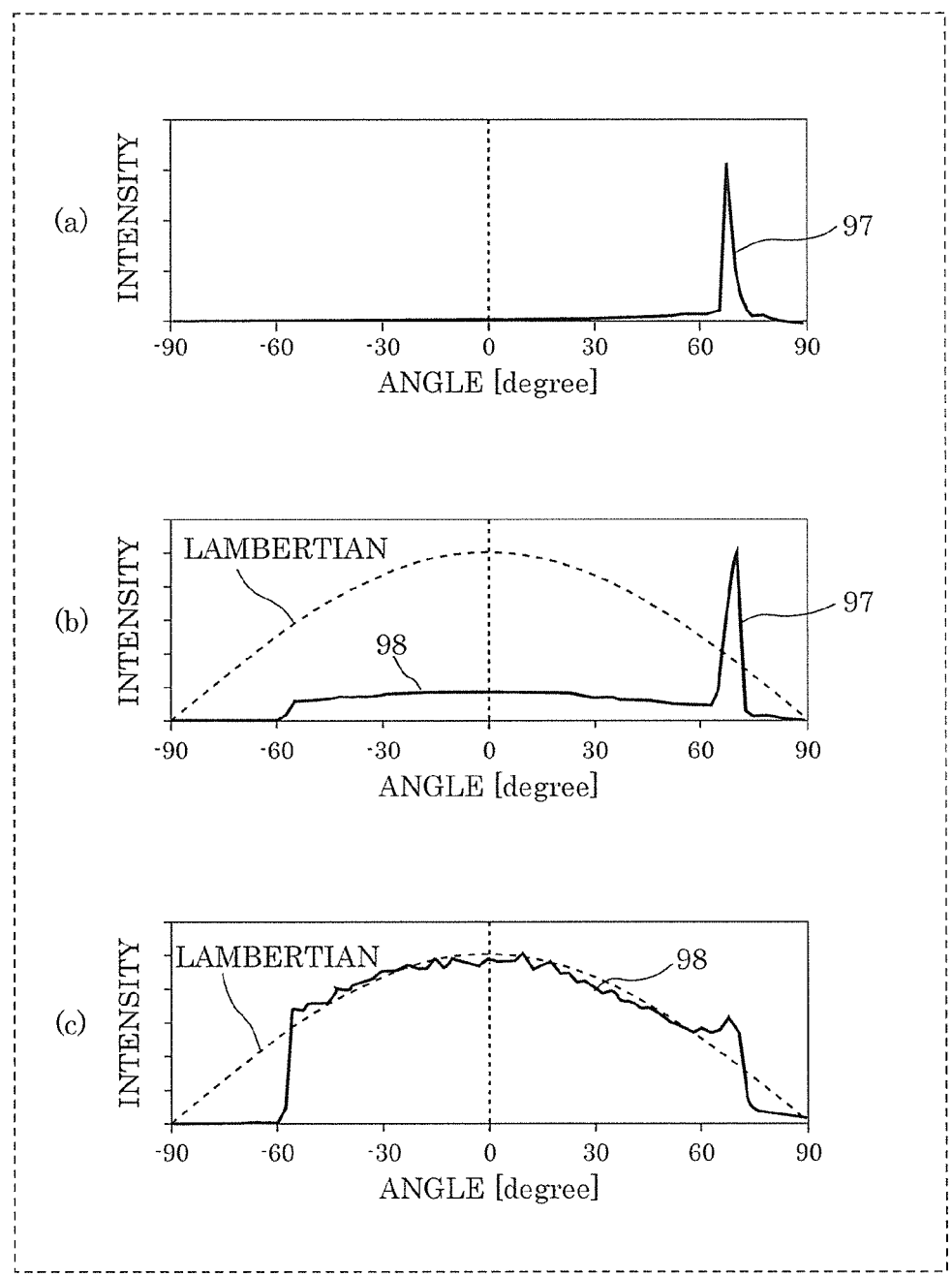
FIG. 20 shows graphs of the results of the angle dependency of the intensity of reflected light in the light scattering portion measured with the measurement system illustrated in FIG. 8 while the light scattering portion is disposed on the support member formed of a silicon substrate.

FIG. 20 shows graphs of the results of measurement of the angle dependency of intensity of reflected light in scattering member 102 using the measurement system illustrated in FIG. 8 where scattering member 102 is disposed on a silicon substrate or support member 2. Graph (a) of FIG. 20 shows results of measurement in the case where only support member 2 is disposed (that is, scattering member 102 is not disposed). Graph (b) of FIG. 20 shows results of measurement in the case where scattering member 102 is disposed on support member 2, scattering member 102 containing TiO₂ particles having a particle diameter distribution of 0.1 µm to 0.7 µm as particles 102b having a high refractive index. Graph (c) of FIG. 20 shows the results of measurement in the case where scattering member 102 is disposed on support member 2, scattering member 102 containing TiO₂ particles having a particle diameter distribution of 0.2 µm to 5 µm as particles 102b having a high refractive index. Here, the term "particle diameter distribution of 0.1 µm to 0.7 µm" indicates that the average particle size (median diameter) D50 is 0.3 µm, the average particle size D10 is 0.1 µm, and the average particle size D90 is 0.7 µm. Here, the term "particle diameter distribution of 0.2 µm to 5 µm" indicates that the average particle size (median diameter) D50 is 1.9 µm, the average particle size D10 is 0.2 µm, and the average particle size D90 is 5 µm.

As illustrated in graph (b) of FIG. 20, in the case where particles 102b having a high refractive index having a relatively small average particle size are used, fine depressions and projections are barely formed on the surface of scattering member 102. For this reason, while part of light components of incident light 96 are scattered into scattered light 98, a large quantity of light of reflected light 97 keeping directivity is also reflected. In contrast, as illustrated in graph (c) of FIG. 20, in the case where particles 102b having a high refractive index having a relatively large average particle size are used, depressions and projections having a sufficient size to have the scattering effect are formed on the surface of scattering member 102. For this reason, only scattered light 98 is observed, and the radiation angle is also closer to that of Lambertian reflection, which is complete diffuse reflection. The dimension of depressions and projections on the surface of scattering member 102 was specifically a peak-to-valley value of less than 1 µm in a 50 µm square region in the case where particles 102b having a high refractive index have a particle diameter of 0.1 µm to 0.7 µm. In contrast, the dimension of depressions and projections on the surface of scattering member 102 was a peak-to-valley value of 1 µm or more in the case where particles 102b having a high refractive index has a particle diameter of 0.2 µm to 5 µm. Furthermore, the degree of scattering of incident light was compared using TiO₂ particles and ZrO₂ particles having different average particle sizes D50 as particles 102b having a high refractive index.

Figure 21:
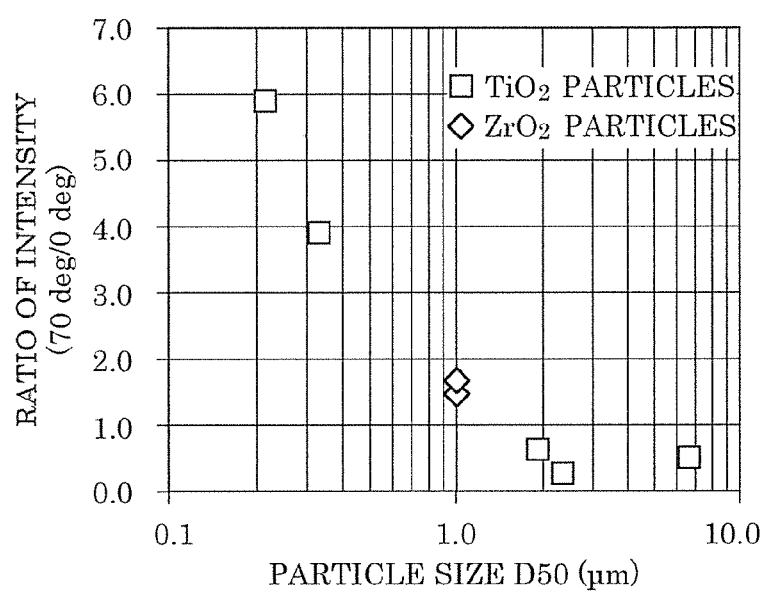
FIG. 21 is a graph showing the relation between the particle diameter of particles having a high refractive index and the degree of scattering.

FIG. 21 is a graph showing the relation between the particle diameter of particles 102b having a high refractive index and the degree of scattering.

The index of the degree of scattering was defined as the ratio (ratio of intensity) of the intensity of light at a radiation angle of 70° to the intensity of light at a radiation angle of 0°. At a radiation angle of 70°, a strong peak is generated in the case where incident light entering from a direction of −70° is reflected while keeping directivity. As illustrated in FIG. 21, the ratio of intensity linearly reduces as particles 102b having a high refractive index have a larger average particle size.

From the results above, a preferred average particle size D50 of particles 102b having a high refractive index forming scattering member 102 is 1 µm to 10 µm where the ratio of intensity is 2 or less.

A wavelength conversion element according to Modification 2 of the present embodiment will now be described. Unlike wavelength conversion element 401 according to Modification 1 of Embodiment 2, the wavelength conversion element according to the present modification includes another scattering member, which is different from scattering member 102 surrounding wavelength conversion member 304, between wavelength conversion member 304 and support member 2. Differences between the wavelength conversion element according to the present modification and wavelength conversion element 401 according to Modification 1 of Embodiment 2 will be mainly described below with reference to the drawings.

Figure 22:
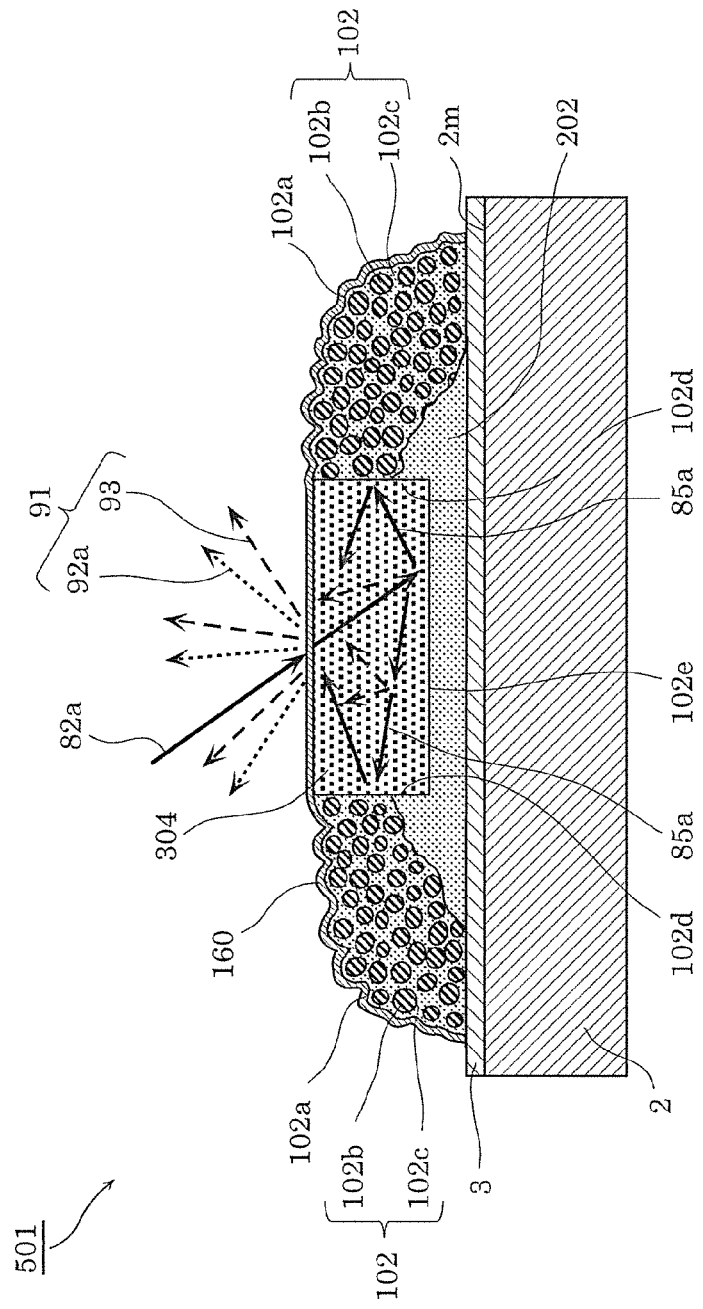
FIG. 22 is a schematic cross-sectional view illustrating a configuration of a wavelength conversion element according to Modification 2 of Embodiment 2.

FIG. 22 is a schematic cross-sectional view illustrating a configuration of wavelength conversion element 501 according to the present modification.

As illustrated in FIG. 22, wavelength conversion element 501 according to the present modification includes scattering member 202 disposed between wavelength conversion member 304 and support member 2, scattering member 202 being different from scattering member 102 surrounding wavelength conversion member 304. Scattering member 202 is one example of the second scattering member described above. Scattering member 202 to be used may be a scattering member containing dispersed particles having a high refractive index, which are different in material and average particle size from those of scattering member 102 which surrounds wavelength conversion member 304. Such a configuration can improve the freedom in configuration of scattering member which covers the bottom surface and lateral surfaces of wavelength conversion member 304.

Supporting surface 2m of support member 2 may include a reflective film formed of a multi-layer dielectric film or a metal reflective film. A metal film to be used can be a film formed of Ag, for example. Such a configuration having a double reflection structure of scattering member 202 and reflective film 3 can efficiently reflect multiple reflection light 85a traveling from wavelength conversion member 304 to support member 2 even if scattering member 202 disposed between wavelength conversion member 304 and support member 2 has a small thickness. Furthermore, the scattering member can also have a small thickness even when a transparent binder having a low thermal conductivity is used as a material for the scattering member disposed between wavelength conversion member 304 and support member 2. For this reason, heat generated in wavelength conversion member 304 can be efficiently dissipated to support member 2. In such a configuration, the scattering member disposed between wavelength conversion member 304 and support member 2 preferably has a thickness of 1 μm or more and 50 μm or less. The configuration including the reflective film described above may be used in the configuration of Embodiment 2 illustrated in FIG. 17.

Furthermore, antireflective film 160 formed of a multi-layer dielectric film may be disposed on the surface of the wavelength conversion member 304 and the surface of scattering member 102. In this case, wavelength conversion member 304 and scattering member 102 having fine depressions and projections 102a on the surface are formed on support member 2, and then a dielectric multi-layer dielectric film can be formed by a film forming method such as sputtering. Because the configuration of the present modification can prevent the reflection of incident light 82 on the surface of wavelength conversion member 304, incident light 82 can efficiently enter wavelength conversion member 304. The configuration including the antireflective film may also be used in the configuration of Embodiment 2 illustrated in FIG. 17.

A wavelength conversion element according to Modification 3 of the present embodiment will now be described. Unlike wavelength conversion element 401 according to Modification 1 of Embodiment 2, the wavelength conversion element according to the present modification includes a configuration which can provide compatibility between the reflection properties and heat dissipating properties between wavelength conversion member 304 and support member 2. Differences between the wavelength conversion element according to the present modification and wavelength conversion element 401 according to Modification 1 of Embodiment 2 will be mainly described below with reference to the drawings.

Figure 23:
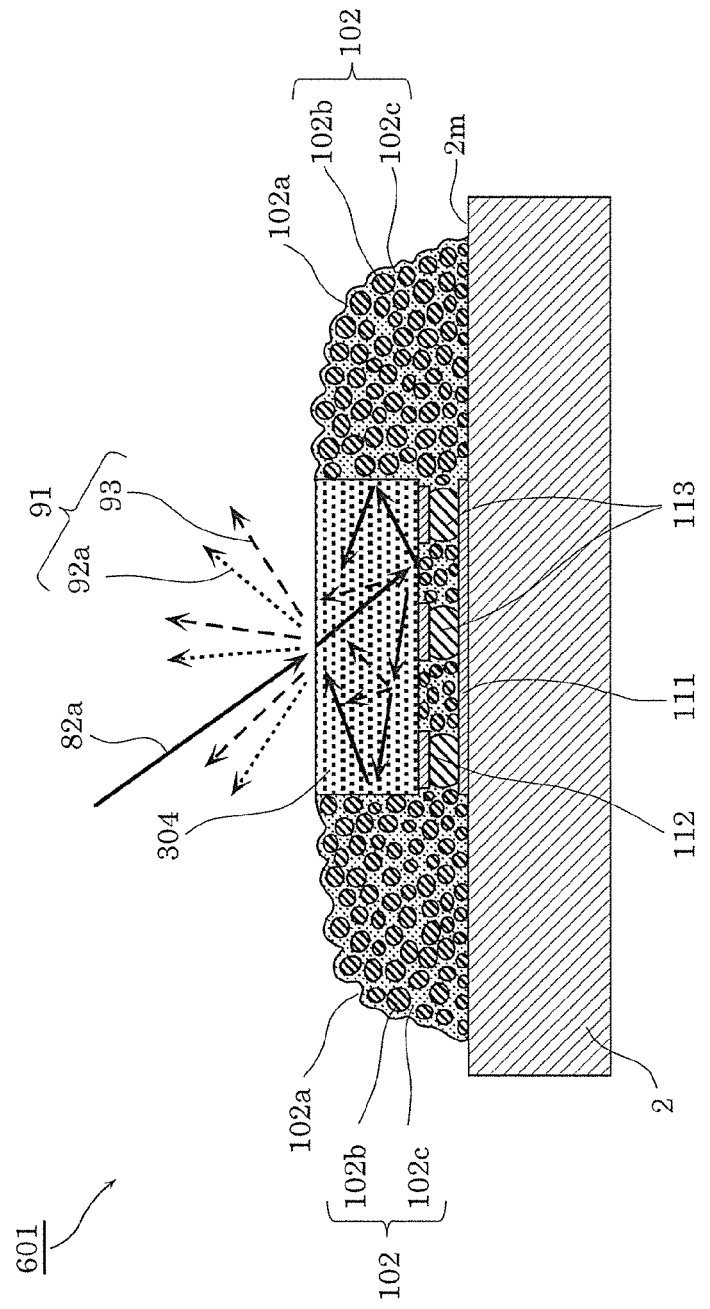
FIG. 23 is a schematic cross-sectional view illustrating a configuration of a wavelength conversion element according to Modification 3 of Embodiment 2.

FIG. 23 is a schematic cross-sectional view illustrating a configuration of wavelength conversion element 601 according to the present modification.

In wavelength conversion element 601 according to the present modification, undercoating 111 formed of a metal film of Ti, Pt, or Au is formed on supporting surface 2m of support member 2, and reflective film 112 formed of Pt, Ag, Ti, Pt, or Au is formed on part of the surface of wavelength conversion member 304 facing support member 2. Bonding layer 113 such as Au bumps is disposed on undercoating 111 to bond reflective film 112 to undercoating 111. Support member 2 including undercoating 111 and bonding layer 113 will now be described with reference to the drawing.

Figure 24:
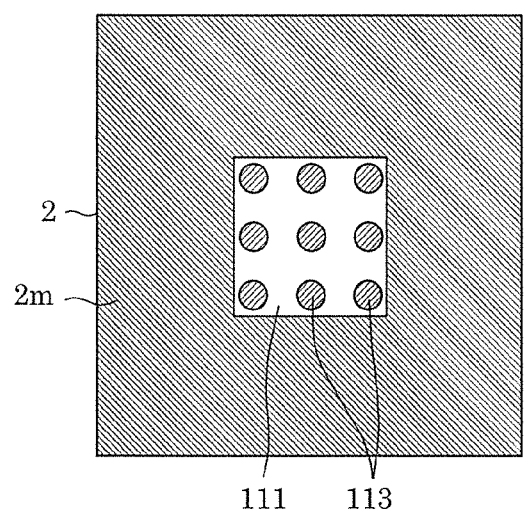
FIG. 24 is a schematic plan view illustrating a configuration of a support member, an undercoating, and a bonding layer according to Modification 3 of Embodiment 2.

FIG. 24 is a schematic plan view illustrating a configuration of support member 2, undercoating 111, and bonding layer 113 according to the present modification. FIG. 24 is a plan view of support member 2 in a top surface view of supporting surface 2m.

As illustrated in FIG. 24, undercoating 111 is disposed in the center of supporting surface 2m of support member 2. Furthermore, bonding layer 113 is disposed on undercoating 111. In the example illustrated in FIG. 24, a plurality of bonding layers 113 is disposed on undercoating 111. The position where bonding layers 113 are disposed corresponds to the position of reflective film 112 disposed in wavelength conversion member 304.

Wavelength conversion member 304 is then disposed such that each of bonding layers 113 contacts reflective film 112 as illustrated in FIG. 24. Thereby, reflective film 112 is bonded to undercoating 111. Scattering member 102 is disposed in a portion between wavelength conversion member 304 and support member 2 where bonding layers 113 are not disposed. In other words, scattering member 102 is one example of the second scattering member described above. A usable process of manufacturing scattering member 102 is a process of disposing paste 124 for a scattering member between wavelength conversion member 304 and support member 2 using a capillary phenomenon, and heating the workpiece. Such a configuration enables design of the configuration for reflection on the bottom surface of wavelength conversion member 304 with higher freedom, and heat generated in wavelength conversion member 304 can be readily dissipated to support member 2 through bonding layers 113.

Materials which can be used in the support members of the wavelength conversion elements according to the embodiments and modifications will now be described with reference to the drawing.

FIG. 25 is a diagram showing the materials examined as material for the support member of the wavelength conversion element according to the present disclosure and their properties. The properties of the materials shown in FIG. 25 are the coefficient of thermal expansion, the thermal conductivity, and the reflectance.

For example, in the case where YAG is used as a fluorescent material and glass is used as a transparent binder, the material to be used in the support member preferably has a coefficient of thermal expansion as close to the coefficient of thermal expansion of glass as possible and a high thermal conductivity as possible. Although silicon is used for the support member in the wavelength conversion elements according to the embodiments and the modifications from the viewpoints described above and the viewpoint of cost, other materials may also be used. For example, use of silicon carbide (SiC) for the support member can prevent an increase in temperature of the wavelength conversion member, and therefore the conversion efficiency of an excited fluorescent substance can be kept. Furthermore, use of silicon carbide (SiC) enables efficient diffuse reflection of excitation light or fluorescence by the support member, and thus an improvement in luminance of the light emitting device.

In the case where incident light is absorbed in support member 2 as in wavelength conversion elements 1a and 1b according to Modification 1 and Modification 2 of Embodiment 1 illustrated in FIGS. 11 and 12, support member 2 may be formed of a material having low reflectance to the light corresponding to the wavelength of excitation light, that is, having high absorptivity.

Embodiment 3

A wavelength conversion element according to Embodiment 3 will now be described. Unlike the wavelength conversion elements according to the embodiments and the modifications described above, the wavelength conversion element according to the present embodiment include a substrate formed of diamond as a support member. The configuration of the support member of the wavelength conversion element according to the present embodiment and the manufacturing process will now be described with reference to the drawings.

Figure 26:
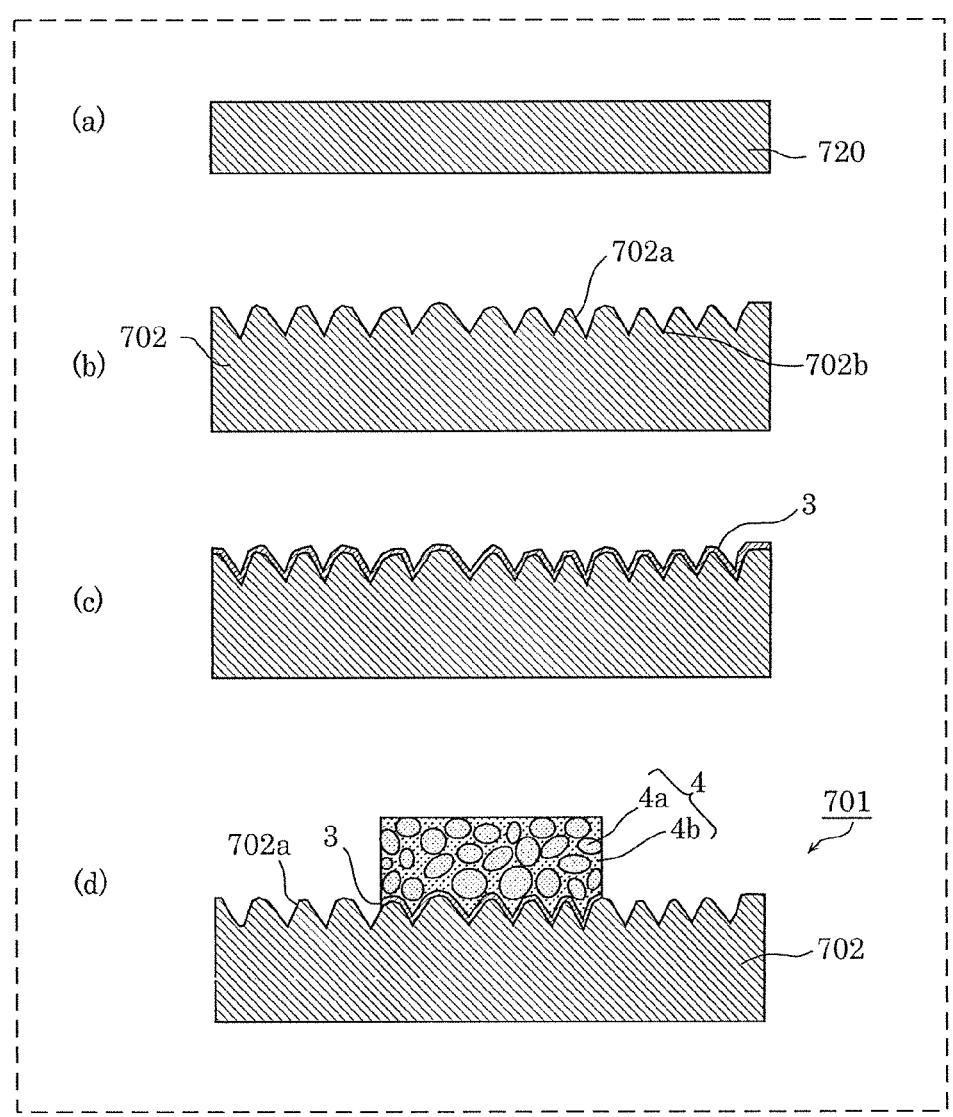
FIG. 26 is a schematic cross-sectional view illustrating steps in a process of manufacturing a wavelength conversion element according to Embodiment 3.

FIG. 26 is a schematic cross-sectional view illustrating the steps in the process of manufacturing wavelength conversion element 701 according to the present embodiment.

As illustrated in cross-sectional view (a) of FIG. 26, seed substrate 720 for forming support member 702 formed of diamond is prepared.

Subsequently, as illustrated in cross-sectional view (b) of FIG. 26, diamond is grown on the main surface of seed substrate 720 to form support member 702. At this time, diamond can be formed by a high pressure synthetic process or a gaseous phase synthetic process, for example. The gaseous phase synthetic process to be used can be microwave plasma CVD. In microwave plasma CVD, diamond crystals can be grown under an atmosphere of reduced pressure using plasma formed by microwave discharging in a stream of hydrogen and methane gas. At this time, diamond crystal growth conditions are controlled to form a second crystal face on the surface, the second crystal face being different from a first crystal face forming a main surface. As a result, inclinations 702a are formed on support member 702.

As illustrated in cross-sectional view (c) of FIG. 26, reflective film 3 is formed on the surface of support member 702.

Subsequently, as illustrated in cross-sectional view (d) of FIG. 26, wavelength conversion member 4 is formed on support member 702 through a step similar to the step illustrated in FIG. 7. Thereby, wavelength conversion element 701 can be formed.

Wavelength conversion element 701 according to the present embodiment can also achieve the effects similar to those of wavelength conversion element 1 according to Embodiment 1. Furthermore, because support member 702 of wavelength conversion element 701 has high thermal conductivity, an increase in temperature of wavelength conversion member 4 can be prevented even when excitation light having high intensity is radiated. For this reason, a reduction in conversion efficiency of fluorescent material 4a within wavelength conversion member 4 can be prevented. Accordingly, a light emitting device including wavelength conversion element 701 according to the present embodiment can have an improved luminance.

Embodiment 4

A light emitting device according to Embodiment 4 will now be described. Unlike light emitting device 60 described in Embodiment 1, the light emitting device according to the present embodiment includes an optical fiber as a propagation path of excitation light. The light emitting device according to the present embodiment will now be described with reference to the drawings.

Figure 27:
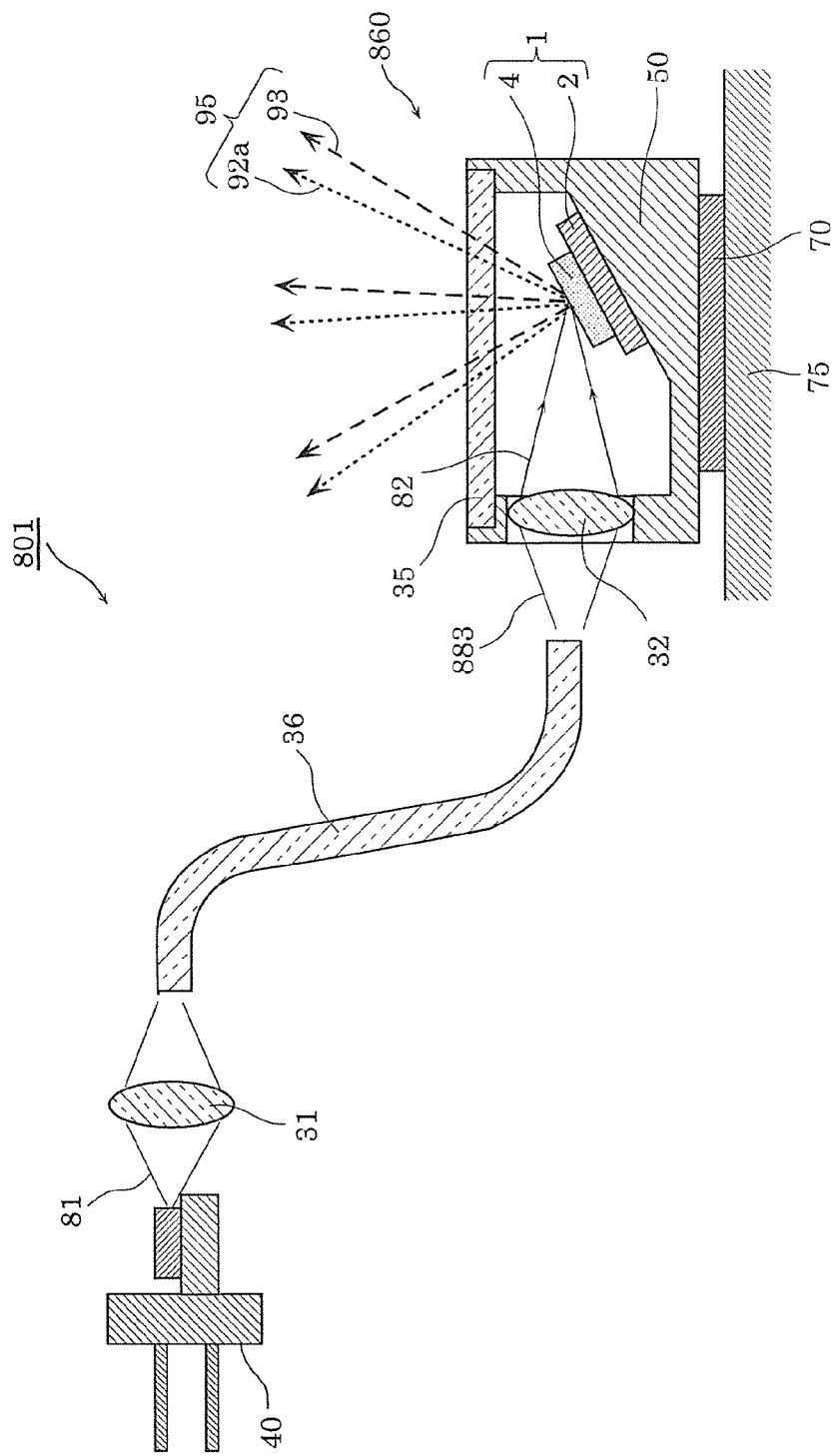
FIG. 27 is a schematic cross-sectional view illustrating a configuration of a light emitting device according to Embodiment 3.

FIG. 27 is a schematic cross-sectional view illustrating a configuration of light emitting device 801 according to the present embodiment.

As illustrated in FIG. 27, light emitting device 801 according to the present embodiment includes excitation light source 40, lens 31, optical fiber 36 and light emitter 860.

Light emitter 860 includes wavelength conversion element 1, fixing member 50, and lens 32.

In light emitting device 801 according to the present embodiment, excitation light 81 emitted from excitation light source 40 is converged through lens 31. The converged excitation light 81 is then connected to optical fiber 36, and propagates through optical fiber 36. Propagating light 883 emitted from optical fiber 36 is converted into incident light 82 as converged light through lens 32 of light emitter 860. Incident light 82 is radiated to wavelength conversion member 4 in wavelength conversion element 1. Incident light 82 is then converted into scattered light 92a and fluorescence 93 by wavelength conversion member 4 and support member 2. Scattered light 92a and fluorescence 93 are emitted from transparent cover member 35 as white emitted light 95 to be emitted from wavelength conversion element 1. Scattered light 92a is light subjected to diffuse reflection by fluorescent material 4a and support member 2. Fluorescence 93 is light having a wavelength converted by fluorescent material 4a and scattered by fluorescent material 4a and support member 2.

At this time, because emitted light 95 having high luminance can be generated in wavelength conversion element 1 of light emitting device 801, white light having high directivity can be emitted. Furthermore, wavelength conversion member 4 can be thermally separated from excitation light source 40, which is a heating body different from wavelength conversion member 4. For this reason, light having higher luminance can be emitted from wavelength conversion member 4.

Other Modifications

Although the light source apparatuses and the light projectors according to the present disclosure have been described based on the embodiments and modifications thereof, these embodiments and modifications should not be construed as limitative to the present disclosure. For example, embodiments obtained by making a variety of modifications of the embodiments and modifications thereof conceivable to those skilled in the art, and embodiments implemented through arbitrary combination of the components and functions of the embodiments and modifications thereof without departing the gist of the present disclosure are also included in the present disclosure.

INDUSTRIAL APPLICABILITY

The wavelength conversion elements and light emitting devices according to the present disclosure can have a high luminance and an illuminance distribution which can be readily controlled, and are useful in a variety of lighting apparatuses and devices, such as headlamps for vehicles and light sources for spotlights.

What is claimed is:
1. A wavelength conversion element, comprising:
a support member having a supporting surface,
a reflective film disposed on the supporting surface, and
a wavelength conversion member disposed on the reflective film and containing a fluorescent material which absorbs excitation light and generates fluorescence,
wherein the supporting surface includes an arrangement region where the wavelength conversion member is disposed, and an outer peripheral region disposed outside the arrangement region and exposed from the wavelength conversion member, a first scattering member is disposed on the reflective film in the outer peripheral region, and contains first particles and a transparent binder, wherein the first particles have a higher refractive index than the transparent binder, and a second scattering member is disposed between the reflective film and the wavelength conversion member in the arrangement region, and is disposed between the reflective film and the first scattering member in the outer peripheral region, and contains particles which are different in average particle size from the first particles.

2. The wavelength conversion element according to claim 1, wherein the support member is a crystalline substrate.

3. The wavelength conversion element according claim 1, wherein the support member contains one selected from the group consisting of silicon, silicon carbide, and diamond.

4. A light emitting device, comprising:
the wavelength conversion element according to claim 1; and
an excitation light source which radiates the excitation light to the wavelength conversion element.

5. The light emitting device according to claim 4, wherein the wavelength conversion element is disposed on a fixing member, and
a holding member is disposed on the outer peripheral region, and is fixed to the fixing member.

6. The light emitting device according to claim 4, wherein the excitation light is radiated to the wavelength conversion member and the first scattering member.

7. The light emitting device according to claim 6, wherein in a cross-section of the supporting surface containing an optical axis of the excitation light, a sum of a width of the first scattering member and a width of the arrangement region is 2.2×2$\omega_0$ or more where $\omega_0$ represents a distance from a position where the excitation light has a maximum intensity to a position where the excitation light has an intensity equal to 1/$e^2$ of the maximum intensity.

8. The light emitting device according to claim 4, wherein an absorption coefficient of the excitation light in the first scattering member is at least equal to an absorption coefficient of the excitation light in the arrangement region.

9. The wavelength conversion element according claim 1, wherein the reflective film includes at least one of a multi-layer dielectric film and a metal film.

10. The wavelength conversion element according claim 1, wherein the first scattering member has depressions and projections at an interface between the first particles and the transparent binder.

11. The wavelength conversion element according to claim 1, wherein the first scattering member has depressions and projections at a surface of the first scattering member.

12. The wavelength conversion element according to claim 1, wherein the first scattering member has depressions and projections at an interface between the first scattering member and its surrounding air.

13. The wavelength conversion element according claim 1, wherein the second scattering member covers a bottom surface and a lateral surface of the wavelength conversion member.

14. The wavelength conversion element according to claim 1, wherein the second scattering member contains second particles which are different in material from the first particles.

15. The wavelength conversion element according claim 1, further comprising:
a multi-layer dielectric film disposed on a surface of the wavelength conversion member and a surface of the first scattering member.

16. The wavelength conversion element according claim 1,
wherein the first particles contain at least one of $TiO_2$, $ZrO_2$, $Al_2O_3$, BN, and AlN, and
the binder contains at least one of silicone and a glass material.

17. A wavelength conversion element, comprising:
a support member having a supporting surface,
a reflective film disposed on the supporting surface, and
a wavelength conversion member disposed on the reflective film and containing a fluorescent material which absorbs excitation light and generates fluorescence,
wherein the supporting surface includes an arrangement region where the wavelength conversion member is disposed, and an outer peripheral region disposed outside the arrangement region and exposed from the wavelength conversion member,
a first scattering member is disposed on the reflective film in the outer peripheral region, and contains first particles and a transparent binder, wherein the first particles have a higher refractive index than the transparent binder,
a second scattering member is disposed between the reflective film and the wavelength conversion member in the arrangement region, and is disposed between the reflective film and the first scattering member in the outer peripheral region, and contains particles which are different in material from the first particles.

18. The wavelength conversion element according claim 17, wherein the reflective film includes at least one of a multi-layer dielectric film and a metal film.

19. The wavelength conversion element according claim 17, wherein the second scattering member covers a bottom surface and a lateral surface of the wavelength conversion member.

20. The wavelength conversion element according claim 17,
wherein the first particles contain at least one of $TiO_2$, $ZrO_2$, $Al_2O_3$, BN, and AlN, and
the binder contains at least one of silicone and a glass material.

* * * * *